US011630307B2

(12) United States Patent
Rudy et al.

(10) Patent No.: US 11,630,307 B2
(45) Date of Patent: Apr. 18, 2023

(54) WEARABLE LASER BASED DISPLAY METHOD AND SYSTEM

(71) Applicant: KYOCERA SLD Laser, Inc., Goleta, CA (US)

(72) Inventors: Paul Rudy, Fremont, CA (US); James W. Raring, Goleta, CA (US); Eric Goutain, Fremont, CA (US); Hua Huang, Fremont, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 233 days.

(21) Appl. No.: 16/921,555

(22) Filed: Jul. 6, 2020

(65) Prior Publication Data

US 2020/0333605 A1    Oct. 22, 2020

Related U.S. Application Data

(60) Continuation of application No. 15/913,674, filed on Mar. 6, 2018, now Pat. No. 10,816,801, which is a
(Continued)

(51) Int. Cl.
*G02B 27/01* (2006.01)
*G02B 6/00* (2006.01)
(Continued)

(52) U.S. Cl.
CPC .......... *G02B 27/0172* (2013.01); *G02B 6/00* (2013.01); *G02B 27/017* (2013.01);
(Continued)

(58) Field of Classification Search
None
See application file for complete search history.

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| JP | 2007068398 A2 | 3/2007 |
| JP | 2007-173467 A | 7/2007 |
| WO | 2008/041521 A1 | 4/2008 |

OTHER PUBLICATIONS

Understanding of Laser, Laser diodes, Laser diode packaging and its relationship to Tungsten Copper, Torrey Hills Technologies, LLC, available at http://www.torreyhillstech.com/Documents/Laser_package_white_paper.pdf, 18 pages.
(Continued)

*Primary Examiner* — Kimberly N. Kakalec
(74) *Attorney, Agent, or Firm* — Kilpatrick Townsend & Stockton LLP

(57) ABSTRACT

The present invention is directed to wearable display technologies. More specifically, various embodiments of the present invention provide wearable augmented reality glasses incorporating projection display systems where one or more laser diodes are used as light source for illustrating images with optical delivery to the eye using transparent waveguides. In one set of embodiments, the present invention provides wearable augmented reality glasses incorporating projector systems that utilize transparent waveguides and blue and/or green laser fabricated using gallium nitride containing material. In another set of embodiments, the present invention provides wearable augmented reality glasses incorporating projection systems having digital lighting processing engines illuminated by blue and/or green laser devices with optical delivery to the eye using transparent waveguides. In one embodiment, the present invention provides wearable augmented reality glasses incorpo-
(Continued)

rating a 3D display system with optical delivery to the eye using transparent waveguides. There are other embodiments as well.

17 Claims, 34 Drawing Sheets

Related U.S. Application Data division of application No. 14/449,700, filed on Aug. 1, 2014, now Pat. No. 9,927,611.

(60) Provisional application No. 61/889,955, filed on Oct. 11, 2013.

(51) Int. Cl.
| | |
|---|---|
| H01S 5/40 | (2006.01) |
| H01S 5/32 | (2006.01) |
| G02B 27/42 | (2006.01) |
| H01S 5/00 | (2006.01) |
| H01S 5/02212 | (2021.01) |
| H01S 5/02216 | (2021.01) |
| H01S 5/10 | (2021.01) |
| H01S 5/20 | (2006.01) |
| H01S 5/22 | (2006.01) |
| H01S 5/343 | (2006.01) |
| H01S 5/30 | (2006.01) |
| H01S 5/02325 | (2021.01) |

(52) U.S. Cl.
CPC ...... *H01S 5/320275* (2019.08); *H01S 5/4093* (2013.01); *G02B 27/4205* (2013.01); *G02B 27/4272* (2013.01); *G02B 2027/0178* (2013.01); *H01S 5/0014* (2013.01); *H01S 5/02212* (2013.01); *H01S 5/02216* (2013.01); *H01S 5/02325* (2021.01); *H01S 5/1039* (2013.01); *H01S 5/2009* (2013.01); *H01S 5/2201* (2013.01); *H01S 5/3063* (2013.01); *H01S 5/32025* (2019.08); *H01S 5/34333* (2013.01); *H01S 5/4012* (2013.01)

(56) References Cited

U.S. PATENT DOCUMENTS

| | | | |
|---|---|---|---|
| 4,911,102 | A | 3/1990 | Manabe et al. |
| 5,331,654 | A | 7/1994 | Jewell et al. |
| 5,334,277 | A | 8/1994 | Nakamura |
| 5,366,953 | A | 11/1994 | Char et al. |
| 5,527,417 | A | 6/1996 | Lida et al. |
| 5,607,899 | A | 3/1997 | Yoshida et al. |
| 5,632,812 | A | 5/1997 | Hirabayashi |
| 5,696,389 | A | 12/1997 | Ishikawa et al. |
| 5,821,555 | A | 10/1998 | Saito et al. |
| 5,888,907 | A | 3/1999 | Tomoyasu et al. |
| 5,926,493 | A | 7/1999 | O'Brien et al. |
| 5,951,923 | A | 9/1999 | Horie et al. |
| 6,069,394 | A | 5/2000 | Hashimoto et al. |
| 6,147,953 | A | 11/2000 | Duncan |
| 6,153,010 | A | 11/2000 | Kiyoku et al. |
| 6,239,454 | B1 | 5/2001 | Glew et al. |
| 6,379,985 | B1 | 4/2002 | Cervantes et al. |
| 6,451,157 | B1 | 9/2002 | Hubacek |
| 6,489,636 | B1 | 12/2002 | Goetz et al. |
| 6,586,762 | B2 | 7/2003 | Kozaki |
| 6,635,904 | B2 | 10/2003 | Goetz et al. |
| 6,680,959 | B2 | 1/2004 | Tanabe et al. |
| 6,734,461 | B1 | 5/2004 | Shiomi et al. |
| 6,755,932 | B2 | 6/2004 | Masuda et al. |
| 6,809,781 | B2 | 10/2004 | Setlur et al. |
| 6,814,811 | B2 | 11/2004 | Ose |
| 6,833,564 | B2 | 12/2004 | Shen et al. |
| 6,858,081 | B2 | 2/2005 | Biwa et al. |
| 6,920,166 | B2 | 7/2005 | Akasaka et al. |
| 7,009,199 | B2 | 3/2006 | Hall |
| 7,033,858 | B2 | 4/2006 | Chai et al. |
| 7,053,413 | B2 | 5/2006 | D'Evelyn et al. |
| 7,063,741 | B2 | 6/2006 | D'Evelyn et al. |
| 7,128,849 | B2 | 10/2006 | Setlur et al. |
| 7,220,324 | B2 | 5/2007 | Baker et al. |
| 7,303,630 | B2 | 12/2007 | Motoki et al. |
| 7,312,156 | B2 | 12/2007 | Granneman et al. |
| 7,323,723 | B2 | 1/2008 | Ohtsuka et al. |
| 7,338,828 | B2 | 3/2008 | Imer et al. |
| 7,358,542 | B2 | 4/2008 | Radkov et al. |
| 7,358,543 | B2 | 4/2008 | Chua et al. |
| 7,390,359 | B2 | 6/2008 | Miyanaga et al. |
| 7,470,555 | B2 | 12/2008 | Matsumura |
| 7,483,466 | B2 | 1/2009 | Uchida et al. |
| 7,489,441 | B2 | 2/2009 | Scheible et al. |
| 7,555,025 | B2 | 6/2009 | Yoshida |
| 7,691,658 | B2 | 4/2010 | Kaeding et al. |
| 7,727,332 | B2 | 6/2010 | Habel et al. |
| 7,733,571 | B1 | 6/2010 | Li |
| 7,749,326 | B2 | 7/2010 | Kim et al. |
| 7,806,078 | B2 | 10/2010 | Yoshida |
| 7,858,408 | B2 | 12/2010 | Mueller et al. |
| 7,862,761 | B2 | 1/2011 | Okushima et al. |
| 7,923,741 | B1 | 4/2011 | Zhai et al. |
| 7,939,354 | B2 | 5/2011 | Kyono et al. |
| 7,968,864 | B2 | 6/2011 | Akita et al. |
| 8,017,932 | B2 | 9/2011 | Okamoto et al. |
| 8,044,412 | B2 | 10/2011 | Murphy et al. |
| 8,124,996 | B2 | 2/2012 | Raring et al. |
| 8,126,024 | B1 | 2/2012 | Raring et al. |
| 8,143,148 | B1 | 3/2012 | Raring et al. |
| 8,189,263 | B1 | 5/2012 | Wang et al. |
| 8,242,522 | B1 | 8/2012 | Raring et al. |
| 8,247,887 | B1 | 8/2012 | Raring et al. |
| 8,252,662 | B1 | 8/2012 | Poblenz et al. |
| 8,254,425 | B1 | 8/2012 | Raring et al. |
| 8,259,769 | B1 | 9/2012 | Raring et al. |
| 8,284,810 | B1 | 10/2012 | Sharma et al. |
| 8,294,179 | B1 | 10/2012 | Raring et al. |
| 8,314,429 | B1 | 11/2012 | Raring et al. |
| 8,351,478 | B2 | 1/2013 | Raring et al. |
| 8,355,418 | B2 | 1/2013 | Raring et al. |
| 8,422,525 | B1 | 4/2013 | Raring et al. |
| 8,634,442 | B1 | 1/2014 | Raring et al. |
| 8,847,249 | B2 | 9/2014 | Raring et al. |
| 9,531,164 | B2 | 12/2016 | Raring et al. |
| 9,543,738 | B2 | 1/2017 | Raring et al. |
| 9,927,611 | B2 | 3/2018 | Rudy et al. |
| 10,816,801 | B2 * | 10/2020 | Rudy .................. G02B 27/017 |
| 2002/0050488 | A1 | 5/2002 | Nikitin et al. |
| 2002/0085603 | A1 | 7/2002 | Okumura |
| 2002/0171092 | A1 | 11/2002 | Goetz et al. |
| 2003/0000453 | A1 | 1/2003 | Unno et al. |
| 2003/0001238 | A1 | 1/2003 | Ban |
| 2003/0012243 | A1 | 1/2003 | Okumura |
| 2003/0020087 | A1 | 1/2003 | Goto et al. |
| 2003/0140846 | A1 | 7/2003 | Biwa et al. |
| 2003/0216011 | A1 | 11/2003 | Nakamura et al. |
| 2004/0025787 | A1 | 2/2004 | Selbrede et al. |
| 2004/0060518 | A1 | 4/2004 | Nakamura et al. |
| 2004/0104391 | A1 | 6/2004 | Maeda et al. |
| 2004/0151222 | A1 | 8/2004 | Sekine |
| 2004/0196877 | A1 | 10/2004 | Kawakami et al. |
| 2004/0222357 | A1 | 11/2004 | King et al. |
| 2004/0247275 | A1 | 12/2004 | Vakhshoori et al. |
| 2004/0262624 | A1 | 12/2004 | Akita et al. |
| 2005/0040384 | A1 | 2/2005 | Tanaka et al. |
| 2005/0072986 | A1 | 4/2005 | Sasaoka |
| 2005/0168564 | A1 | 8/2005 | Kawaguchi et al. |
| 2005/0224826 | A1 | 10/2005 | Keuper et al. |
| 2005/0229855 | A1 | 10/2005 | Raaijmakers |
| 2005/0285128 | A1 | 12/2005 | Scherer et al. |
| 2006/0030738 | A1 | 2/2006 | Vanmaele et al. |
| 2006/0037529 | A1 | 2/2006 | D'Evelyn et al. |
| 2006/0038193 | A1 | 2/2006 | Wu et al. |
| 2006/0060131 | A1 | 3/2006 | Atanackovic |

(56) References Cited

U.S. PATENT DOCUMENTS

| | | |
|---|---|---|
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0252918 A1* | 11/2007 | Furuya .................. G02B 27/48 348/742 |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0265702 A1 | 10/2010 | Abe et al. |
| 2010/0277803 A1 | 11/2010 | Pockett et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0199582 A1 | 8/2011 | Kuriki et al. |
| 2011/0216795 A1 | 9/2011 | Hsu et al. |
| 2011/0247556 A1 | 10/2011 | Raring et al. |
| 2011/0286484 A1 | 11/2011 | Raring et al. |
| 2012/0002256 A1 | 1/2012 | Lacoste et al. |
| 2012/0062998 A1 | 3/2012 | Schultz et al. |
| 2012/0213240 A1 | 8/2012 | Bhat et al. |
| 2012/0242698 A1 | 9/2012 | Haddick et al. |
| 2013/0234111 A1 | 9/2013 | Pfister et al. |
| 2015/0103404 A1 | 4/2015 | Rudy et al. |
| 2018/0239148 A1 | 8/2018 | Rudy et al. |

OTHER PUBLICATIONS

U.S. Appl. No. 12/481,543, Non-Final Office Action dated Jun. 27, 2011, 10 pages.

U.S. Appl. No. 12/482,440, Final Office Action dated Aug. 12, 2011, 7 pages.

U.S. Appl. No. 12/482,440, Non-Final Office Action dated Feb. 23, 2011, 6 pages.

U.S. Appl. No. 12/484,924, Final Office Action dated Oct. 31, 2011, 11 pages.

U.S. Appl. No. 12/484,924, Non-Final Office Action dated Apr. 14, 2011, 12 pages.

U.S. Appl. No. 12/491,169, Final Office Action dated May 11, 2011, 10 pages.

U.S. Appl. No. 12/491,169, Non-Final Office Action dated Oct. 22, 2010, 10 pages.

U.S. Appl. No. 12/497,289, Non-Final Office Action dated Feb. 2, 2012, 7 pages.

U.S. Appl. No. 12/497,289, Notice of Allowance dated May 22, 2012, 7 pages.

U.S. Appl. No. 12/502,058, Final Office Action dated Aug. 19, 2011, 13 pages.

U.S. Appl. No. 12/502,058, Non-Final Office Action dated Dec. 8, 2010, 15 pages.

U.S. Appl. No. 12/502,058, Notice of Allowance dated Apr. 16, 2012, 10 pages.

U.S. Appl. No. 12/534,829, Non-Final Office Action dated Apr. 19, 2011, 9 pages.

U.S. Appl. No. 12/534,829, Notice of Allowance dated Dec. 21, 2011, 4 pages.

U.S. Appl. No. 12/534,829, Notice of Allowance dated Dec. 5, 2011, 7 pages.

U.S. Appl. No. 12/534,829, Notice of Allowance dated Oct. 28, 2011, 8 pages.

U.S. Appl. No. 12/573,820, Final Office Action dated Oct. 11, 2011, 23 pages.

U.S. Appl. No. 12/573,820, Non-Final Office Action dated Mar. 2, 2011, 19 pages.

U.S. Appl. No. 12/749,466, Final Office Action dated Feb. 3, 2012, 16 pages.

U.S. Appl. No. 12/749,466 Notice of Allowance dated Jan. 2, 2013, 8 pages.

(56) References Cited

OTHER PUBLICATIONS

U.S. Appl. No. 12/749,466, Non-Final Office Action dated Jul. 3, 2012, 18 pages.
U.S. Appl. No. 12/749,466, Non-Final Office Action dated Jun. 29, 2011, 20 pages.
U.S. Appl. No. 12/749,476, Final Office Action dated Nov. 8, 2011, 11 pages.
U.S. Appl. No. 12/749,476, Non-Final Office Action dated Apr. 11, 2011, 15 pages.
U.S. Appl. No. 12/749,476, Notice of Allowance dated May 4, 2012, 8 pages.
U.S. Appl. No. 12/759,273, Non-Final Office Action dated Nov. 21, 2011, 10 pages.
U.S. Appl. No. 12/759,273, Non-Final Office Action dated Apr. 3, 2014, 15 pages.
U.S. Appl. No. 12/759,273, Non-Final Office Action dated Jan. 29, 2015, 15 pages.
U.S. Appl. No. 12/759,273, Non-Final Office Action dated Sep. 23, 2015, 17 pages.
U.S. Appl. No. 12/759,273, Notice of Allowance dated Aug. 19, 2016, 8 pages.
U.S. Appl. No. 12/759,273, Final Office Action dated Jun. 26, 2012, 10 pages.
U.S. Appl. No. 12/759,273, Final Office Action dated Oct. 24, 2014, 16 pages.
U.S. Appl. No. 12/759,273, Final Office Action dated Jun. 8, 2015, 17 pages.
U.S. Appl. No. 12/759,273, Final Office Action dated Mar. 29, 2016, 12 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271, Notice of Allowance dated Aug. 8, 2012, 8 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/868,441, Non-Final Office Action dated Apr. 30, 2012, 12 pages.
U.S. Appl. No. 12/868,441, Final Office Action dated Dec. 18, 2012, 33 pages.
U.S. Appl. No. 12/868,441, Notice of Allowance dated Sep. 18, 2013, 13 pages.
U.S. Appl. No. 12/873,820, Non-Final Office Action dated Oct. 4, 2012, 10 pages.
U.S. Appl. No. 12/880,803, Non-Final Office Action dated Feb. 22, 2012, 9 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 8 pages.
U.S. Appl. No. 12/883,652, Non-Final Office Action dated May 14, 2014, 13 pages.
U.S. Appl. No. 12/883,652, Non-Final Office Action dated Jun. 3, 2015, 16 pages.
U.S. Appl. No. 12/883,652, Non-Final Office Action dated Apr. 5, 2016, 11 pages.
U.S. Appl. No. 12/883,652, Notice of Allowance dated Aug. 30, 2016, 7 pages.
U.S. Appl. No. 12/883,652, Final Office Action dated Jan. 11, 2013, 11 pages.
U.S. Appl. No. 12/883,652, Final Office Action dated Dec. 19, 2014, 16 pages.
U.S. Appl. No. 12/883,652, Final Office Action dated Oct. 26, 2015, 11 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 13/014,622, Final Office Action dated Apr. 30, 2012, 14 pages.
U.S. Appl. No. 13/014,622, Non-Final Office Action dated Nov. 28, 2011, 14 pages.
U.S. Appl. No. 13/046,565, Final Office Action dated Feb. 2, 2012, 17 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 14/449,700, Final Office Action dated Dec. 22, 2016, 15 pages.
U.S. Appl. No. 14/449,700, Non-Final Office Action dated May 2, 2016, 15 pages.
U.S. Appl. No. 14/449,700, Non-Final Office Action dated Jun. 9, 2017, 18 pages.
U.S. Appl. No. 14/449,700, Notice of Allowance dated Nov. 13, 2017, 7 pages.
U.S. Appl. No. 14/449,700, Restriction Requirement dated Jan. 4, 2016, 6 pages.
U.S. Appl. No. 15/913,674 First Action Interview Pilot Program Pre-Interview Communication dated Feb. 19, 2020, 10 pages.
U.S. Appl. No. 15/913,674, Notice of Allowance dated Jun. 24, 2020, 8 pages.
Abare et al., Cleaved and Etched Facet Nitride Laser Diodes, IEEE Journal of Selected Topics in Quantum Electronics, vol. 4, No. 3, May-Jun. 1998, pp. 505-509.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.
Asano et al., 100-mW Kink-Free Blue-Violet Laser Diodes with Low Aspect Ratio, IEEE Journal of Quantum Electronics, vol. 39, No. 1, Jan. 2003, pp. 135-140.
Bernardini et al., Spontaneous Polarization and Piezoelectric Constants of III-V Nitrides, Physical Review B, vol. 56, No. 16, Oct. 15, 1997, pp. 10024-10027.
Caneau et al., Studies on the Selective OMVPE of (Ga,In)/(As,P), Journal of Crystal Growth, vol. 124, Nov. 1, 1992, pp. 243-248.
Chen et al., Growth and Optical Properties of Highly Uniform and Periodic InGaN Nanostructures, Advanced Materials, vol. 19, 2007, pp. 1707-1710.
D'Evelyn et al., Bulk GaN Crystal Growth by the High-Pressure Ammonothermal Method, Journal of Crystal Growth, vol. 300, No. 1, Mar. 1, 2007, pp. 11-16.
Founta et al., Anisotropic Morphology of Nonpolar a-Plane GaN Quantum Dots and Quantum Wells, Journal of Applied Physics, vol. 102, No. 7, 2007, pp. 074304-1-074304-6.
Fujii et al., Increase in the Extraction Efficiency of GaN-Based Light-Emitting Diodes via Surface Roughening, Applied Physics Letters, vol. 84, No. 6, 2004, pp. 855-857.
Funato et al., Blue, Green, and Amber InGaN/GaN Light-Emitting Diodes on Semipolar {1122} GaN Bulk Substrates, Journal of Japanese Applied Physics, vol. 45, No. 26, 2006, pp. L659-L662.

(56) References Cited

OTHER PUBLICATIONS

Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.
Gardner et al., Blue-Emitting InGaN—GaN Double-Heterostructure Light-Emitting Diodes Reaching Maximum Quantum Efficiency Above 200A/cm2, Applied Physics Letters, vol. 91, 2007, pp. 243506-1-243506-3.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Issue 1-3, May 6, 1999, pp. 104-111.
Iso et al., High Brightness Blue InGaN/GaN Light Emitting Diode on Nonpolar m-Plane Bulk GaN Substrate, Japanese Journal of Applied Physics, vol. 46, No. 40, 2007, pp. L960-L962.
Kendall et al., Energy Savings Potential of Solid State Lighting in General Lighting Applications, Report for the Department of Energy, 2001, pp. 1-35.
Khan et al., Cleaved Cavity Optically Pumped InGaN—GaN Laser Grown on Spinel Substrates, Applied Physics Letters, vol. 69, No. 16, Oct. 14, 1996, pp. 2418-2420.
Kim et al., Improved Electroluminescence on Nonpolar m-Plane InGaN/GaN Qantum Well LEDs, Physica Status Solidi (RRL), vol. 1, No. 3, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, 2004, pp. 7032-7035.
Lippert, The Avionics Handbook, Chapter 6: Display Devices: RSDTM (Retinal Scanning Display), CRC Press, available at http://www.davi.ws/avionics/TheAvionicsHandbook_Cap_6.pdf, 2000, 8 pages.
Masui et al., Electrical Characteristics of Nonpolar InGaN-Based Light-Emitting Diodes Evaluated at Low Temperature, Japanese Journal of Applied Physics, vol. 46, No. 11, 2007, pp. 7309-7310.
Michiue et al., Recent Development of Nitride LEDs and LDs, Proceedings of SPIE, vol. 7216, 2009, pp. 72161Z-1-72161Z-6.
Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, No. 2, 1998, pp. 211-213.
Nam et al., Lateral Epitaxial Overgrowth of GaN Films on SiO2 Areas via Metalorganic Vapor Phase Epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics, JJAP Express Letter, vol. 46, No. 9, 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, Jun. 20, 2008, pp. 072201-1-072201-3.
Okamoto et al., Pure Blue Laser Diodes Based on Nonpolar m-Piane Gallium Nitride with InGaN Waveguiding Layers, Journal of Japanese Applied Physics, vol. 46, No. 35, 2007, pp. L820-L822.
Okubo, Nichia Develops Blue-green Semiconductor Laser w/488nm Wavelength, Nikkei Technology Online, http://techon.nikkeibp.co.jp/english/NEWS_EN/20080122/146009/, Jan. 22, 2008, 3 pages.
Park, Crystal Orientation Effects on Electronic Properties of Wurtzite InGaN/GaN Quantum Wells, Journal of Applied Physics, vol. 91, No. 12, Jun. 15, 2002, pp. 9904-9908.
International Application No. PCT/US2009/046786, International Search Report and Written Opinion dated May 13, 2010, 8 pages.
International Application No. PCT/US2009/047107, International Search Report and Written Opinion dated Sep. 29, 2009, 10 pages.
International Application No. PCT/US2009/052611, International Search Report dated Sep. 29, 2009, 3 pages.
International Application No. PCT/US2010/030939, International Search Report and Written Opinion dated Jun. 16, 2010, 9 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 9 pages.
Purvis, Changing the Crystal Face of Gallium Nitride, The Advance Semiconductor Magazine, III-Vs Review, vol. 18, No. 8, Nov. 8, 2005, 3 pages.
Romanov et al., Strain-Induced Polarization in Wurtzite III-Nitride Semipolar Layers, Journal of Applied Physics, vol. 100, Jul. 25, 2006, pp. 023522-1-023522-10.
Sato et al., High Power and High Efficiency Green Light Emitting Diode on Free-Standing Semipolar (1122) Bulk GaN Substrate, Physica Status Sol. (RRL), vol. 1, No. 4, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.
Schmidt et al., Demonstration of Nonpolar m-Plane InGaN/GaN Laser Diodes, Japanese Journal of Applied Physics, vol. 46, No. 9, 2007, pp. L190-L191.
Schmidt et al., High Power and High External Efficiency m-Plane InGaN Light Emitting Diodes, Japanese Journal of Applied Physics, vol. 46, No. 7, Feb. 9, 2007, pp. L126-L128.
Schoedl et al., Facet Degradation of GaN Heterostructure Laser Diodes, Journal of Applied Physics, vol. 97, No. 12, 2005, pp. 123102-1-123102-8.
Shchekin et al., High Performance Thin-Film Flip-Chip InGaN—GaN Light-Emitting Diodes, Applied Physics Letters, vol. 89, Aug. 16, 2006, pp. 071109-1-071109-3.
Shen et al., Auger Recombination in InGaN Measured by Photoluminescence, Applied Physics Letters, vol. 91, Oct. 1, 2007, pp. 141101-1-141101-3.
Sizov et al., 500-nm Optical Gain Anisotropy of Semipolar (1122) InGaN Quantum Wells, Applied Physics Express, vol. 2, Jun. 19, 2009, pp. 071001-1-071001-3.
Tomiya et al., Dislocation Related Issues in the Degradation of GaN-Based Laser Diodes, IEEE Journal of Selected Topics in Quantum Electronics, vol. 10, No. 6, Nov.-Dec. 2004, pp. 1277-1286.
Tyagi et al., High Brightness Violet InGan/Gan Light EMitting Diodes on Semipolar (1011) Bulk Gan Substrates, Japanese Journal of Applied Physics, vol. 46, No. 7, Feb. 9, 2007, pp. L129-L131.
Uchida et al., Recent Progress in High-Power Blue-Violet Lasers, IEEE Journal of Selected Topics in Quantum Electronics, vol. 9, No. 5, 2003, pp. 1252-1259.
Waltereit et al., Nitride Semiconductors Free of Electrostatic Fields for Efficient White Light-Emitting Diodes, Nature, vol. 406, Aug. 24, 2000, pp. 865-868.
Wierer et al., High-Power AlGaInN Flip-Chip Light-Emitting Diodes, Applied Physics Letters, vol. 78, No. 22, 2001, pp. 3379-3381.
Yamaguchi, Anisotropic Optical Matrix Elements in Strained GaN-Quantum Wells with Various Substrate Orientations, Physica Status Solidi (PSS), vol. 5, No. 6, May 2008, pp. 2329-2332.
Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.
Yu et al., Multiple Wavelength Emission from Semipolar InGaN/GaN Quantum Wells Selectively Grown by MOCVD, Conference on Lasers and Electro-Optics/Quantum, Electronics and Laser Science Conference and Photonic Applications Systems Technologies, OSA Technical Digest (CD), 2007, 2 pages.
Zhong et al., Demonstration of High Power Blue-Green Light Emitting Diode on Semipolar (1122) Bulk GaN Substrate, Electronics Letters, vol. 43, No. 15, Jul. 19, 2007, 2 pages.
Zhong et al., High Power and High Efficiency Blue Light Emitting Diode on Freestanding Semipolar (1011) Bulk GaN Substrate, Applied Physics Letter, vol. 90, No. 23, 2007, pp. 233504-1-233504-3.

* cited by examiner

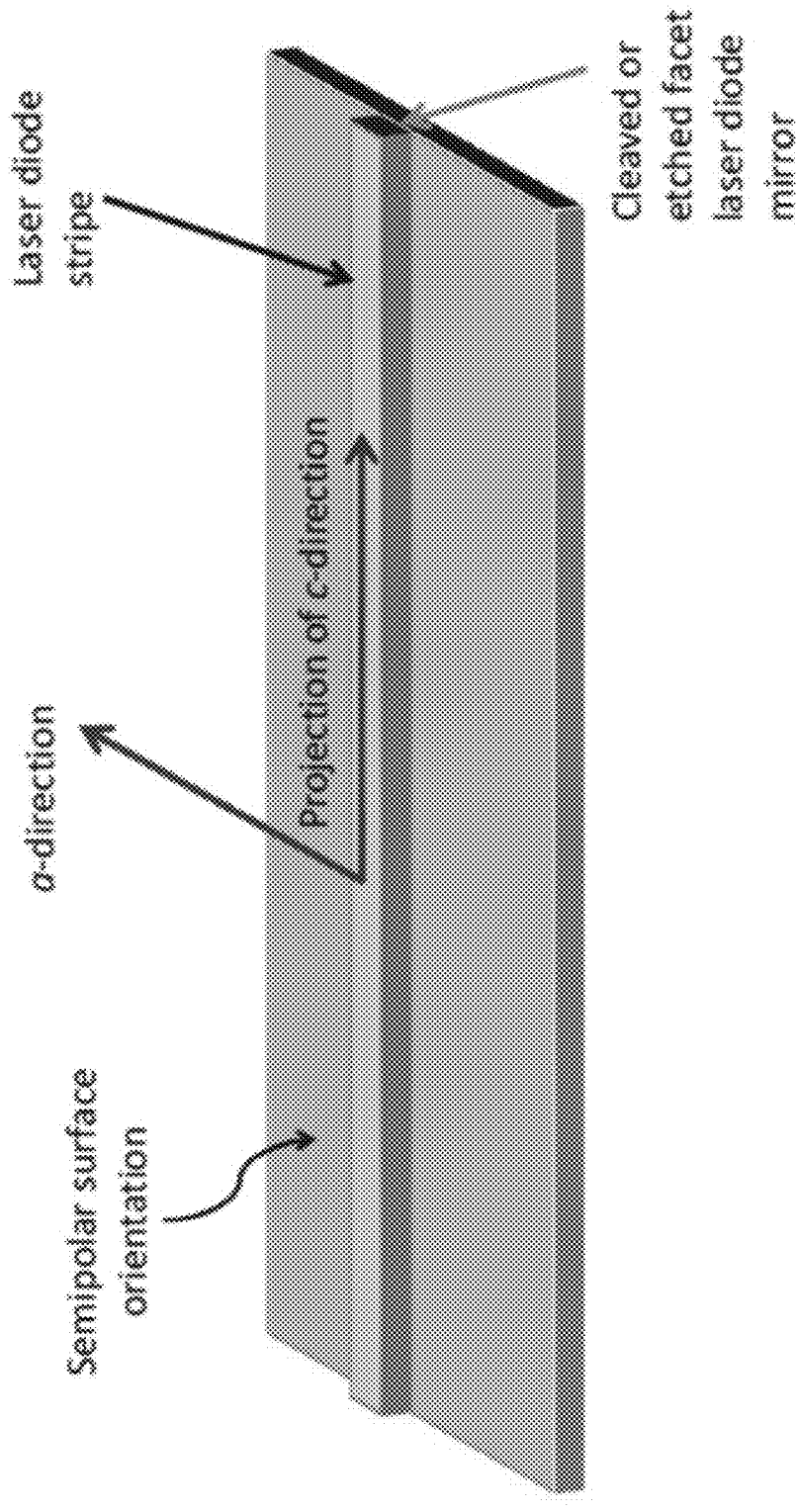

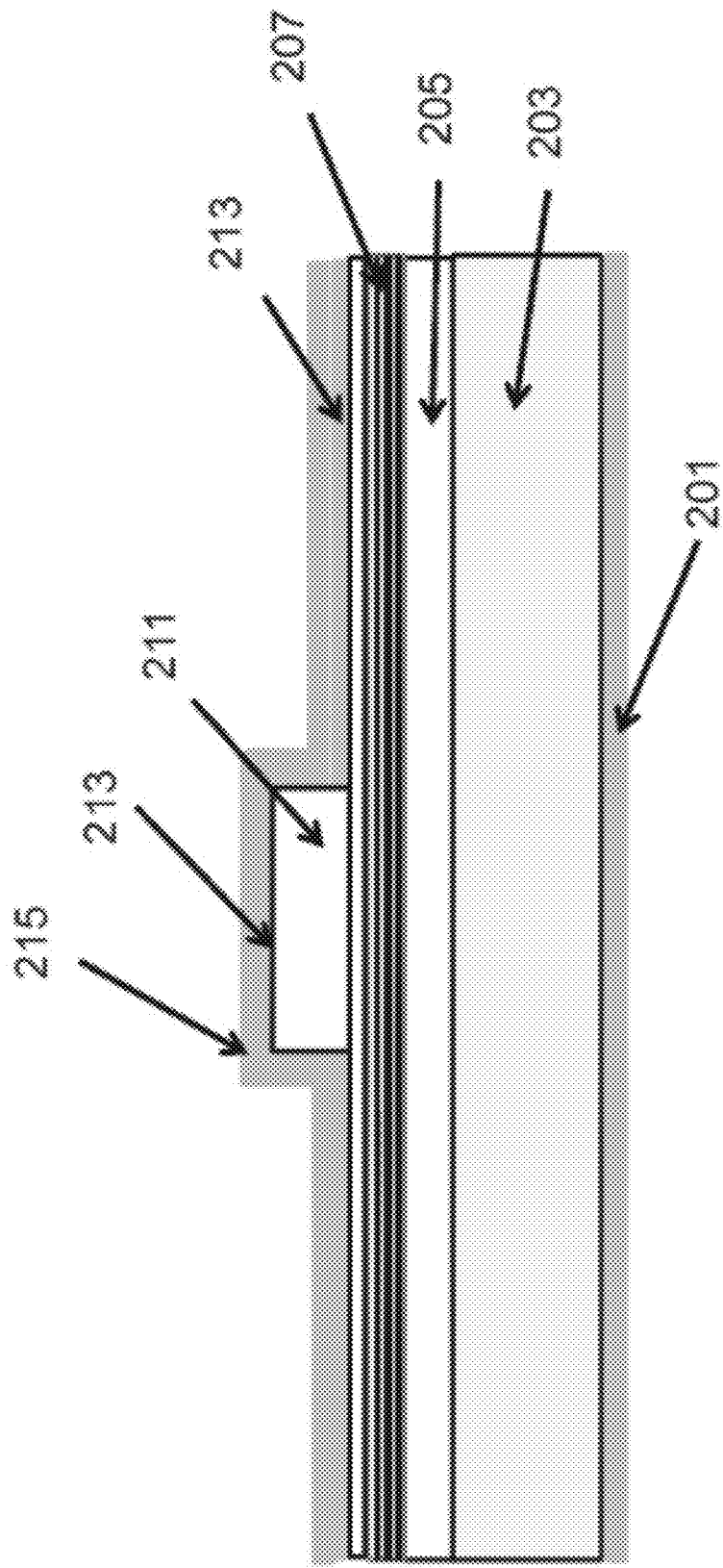
Figure 2: Schematic cross-section of ridge laser diode
Schematic cross-section diagram of ridge type laser diode showing various features associated with the device.

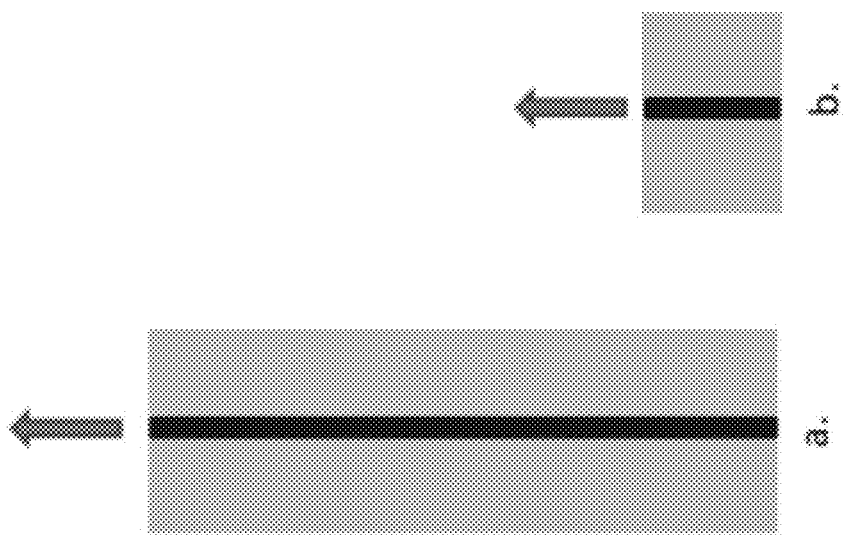
Figure 3: Example top view schematic of conventional in-plane GaN LD versus short cavity GaN LD
Figure 3: Example top view schematic of (a) conventional in-plane GaN LD with cavity length in the 450 to 600um range along with (b) a short cavity GaN LD with a cavity length of 50um to 300um.

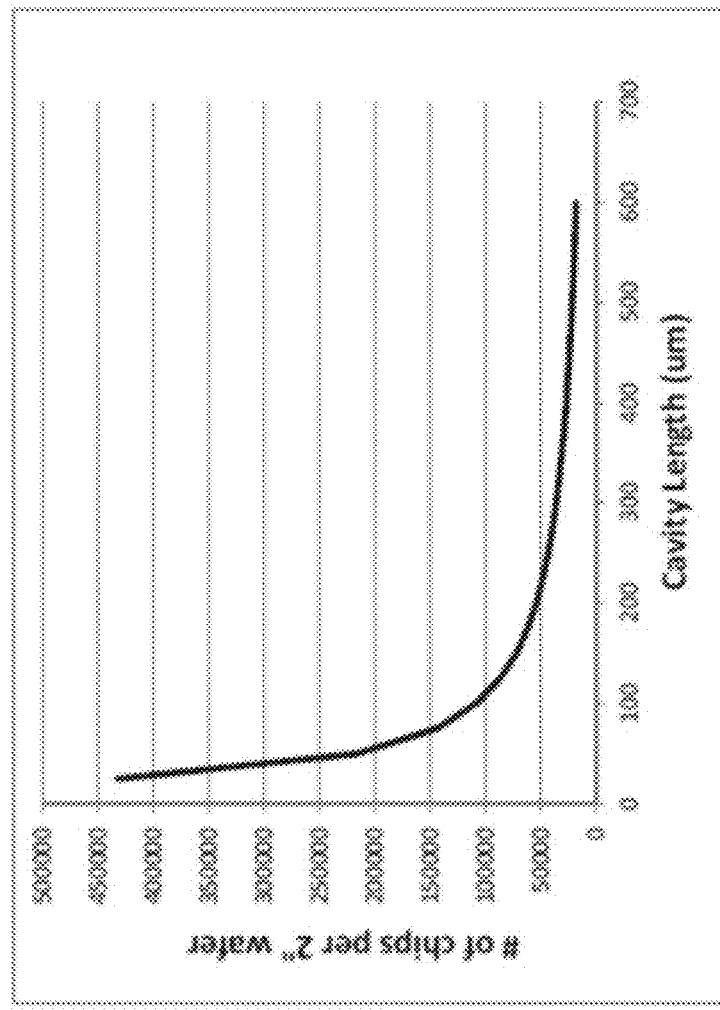
Figure 4: Number of chips per 2" wafer vs cavity length
Calculated number of chips per 2" wafer on laser cavity length for blue LDs, where 150um wide chip width and 80% utilization are assumed. At 100um cavity length, over 100k unyielded chips could be obtained from a 2" wafer

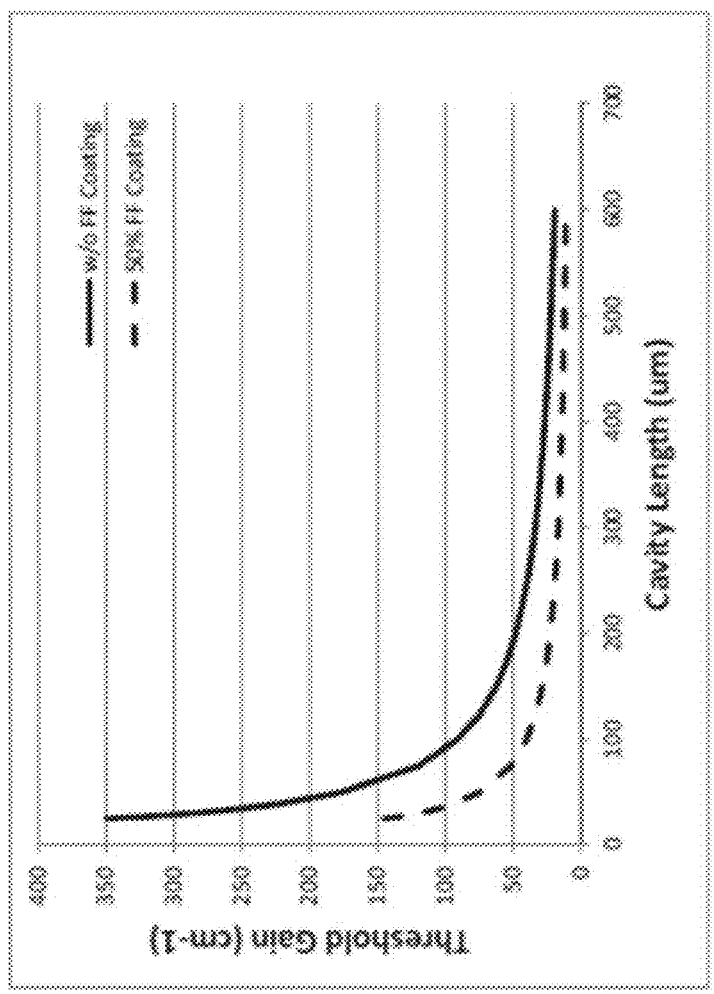
Figure 5: Threshold modal gain versus cavity length of GaN LD

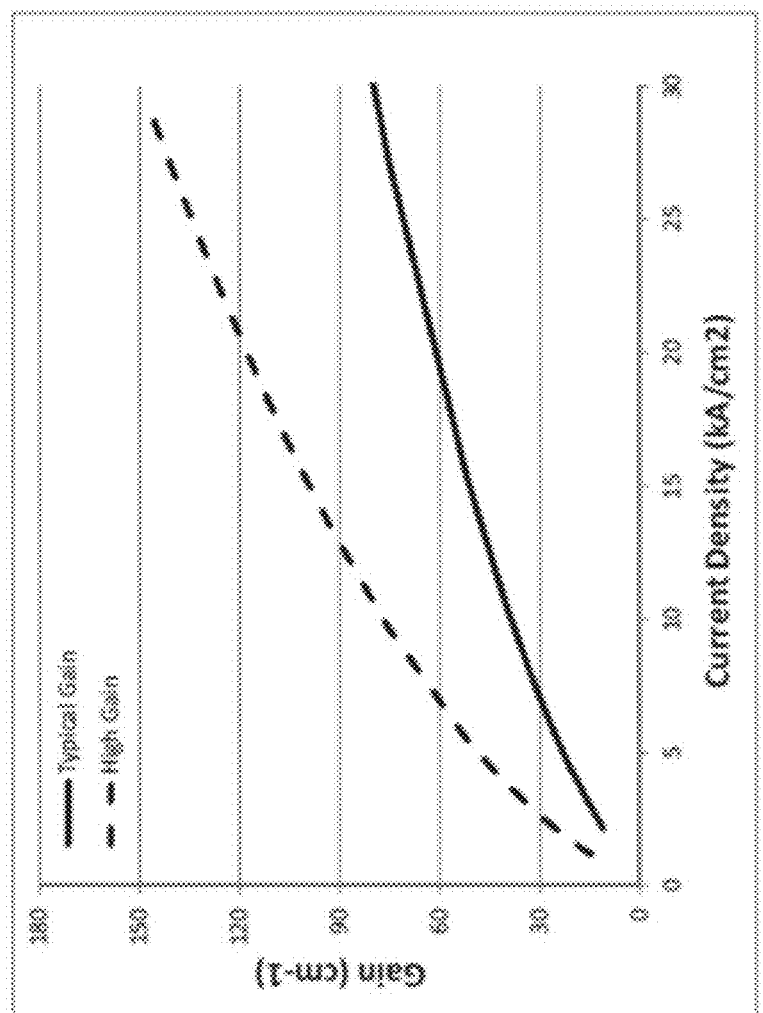
Figure 6: Gain versus current density of typical gain and high gain GaN LD

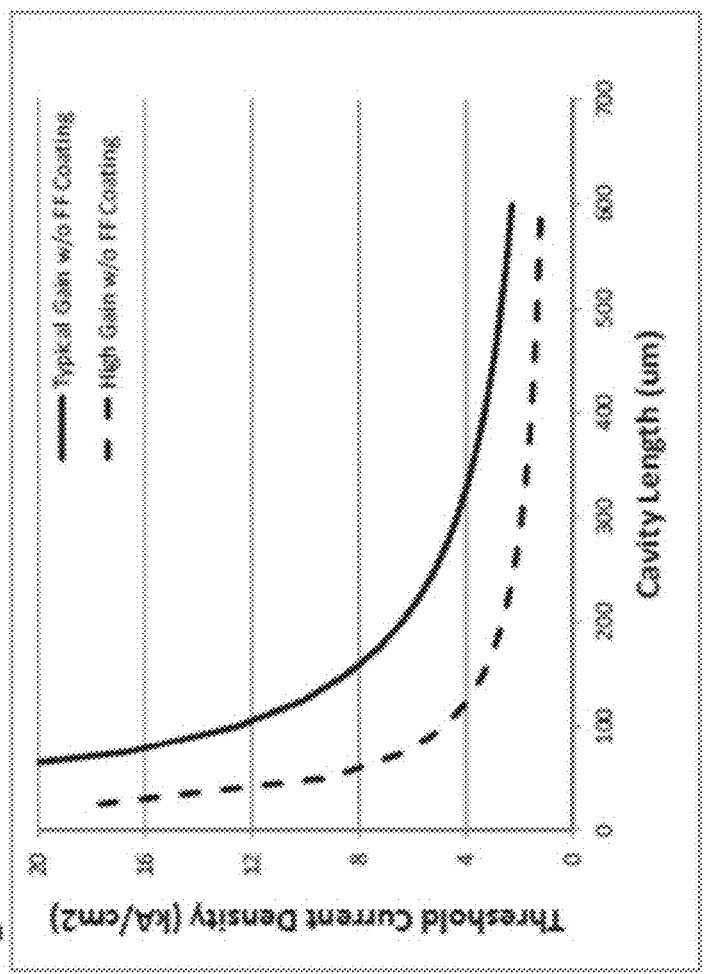
Figure 7a: Threshold current density versus cavity length of typical gain and high gain GaN LD

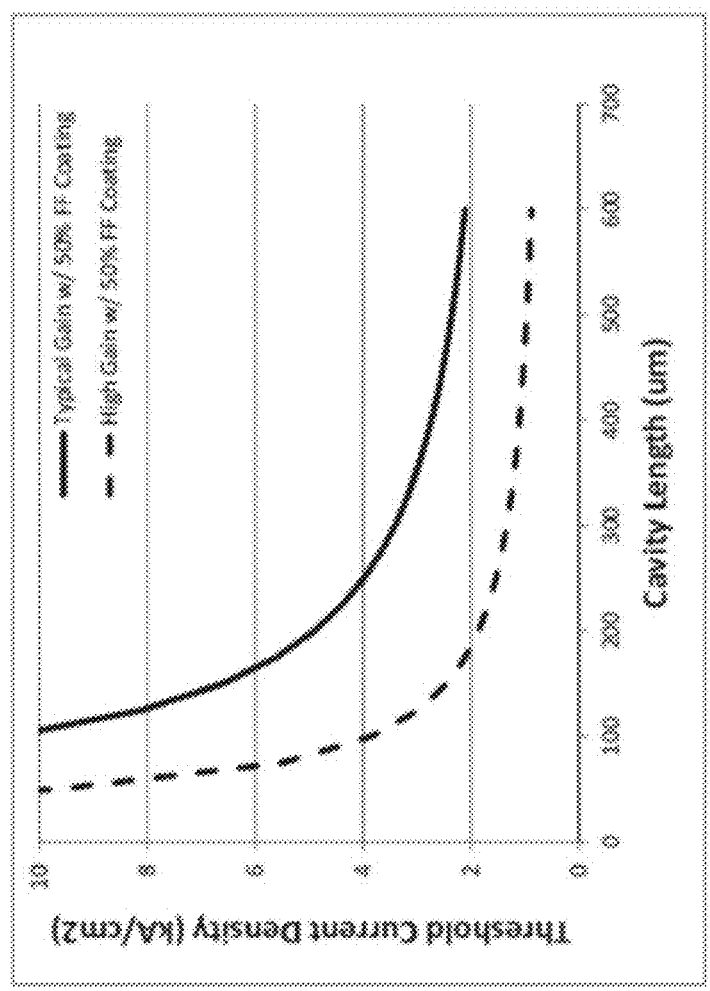
Figure 7b: Threshold current density versus cavity length of typical gain and high gain GaN LD

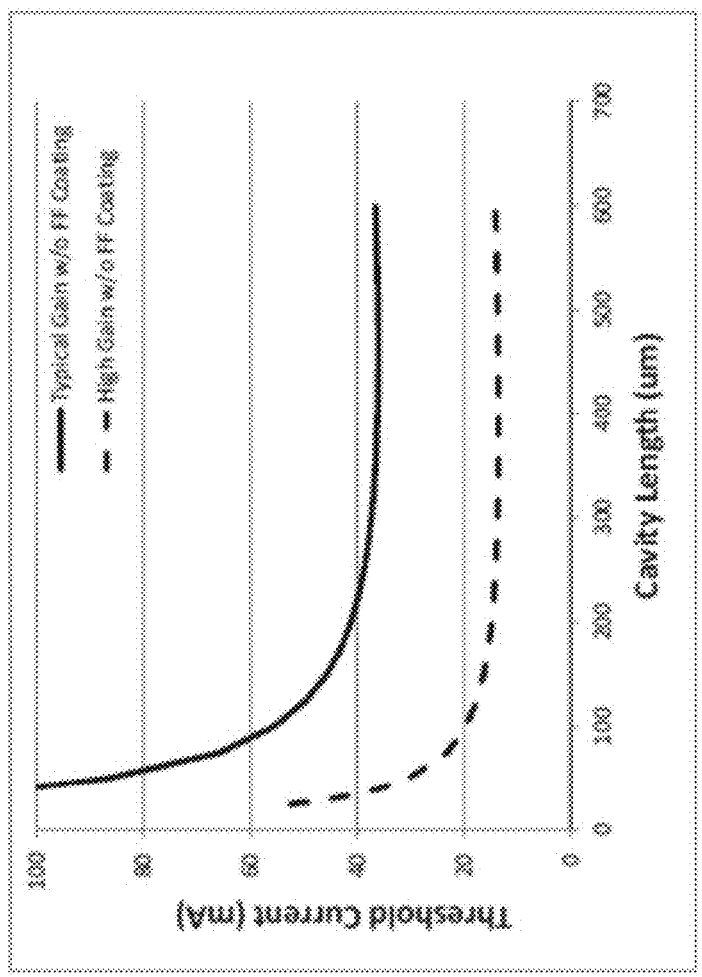
Figure 8a: Threshold current versus cavity length of typical gain and high gain GaN LD

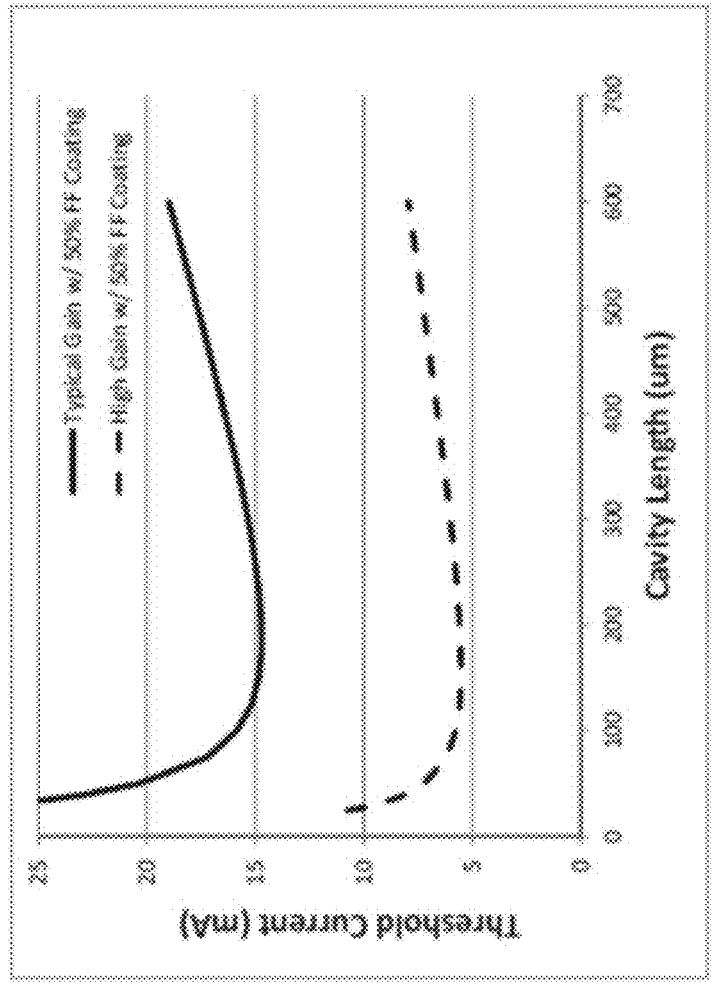
Figure 8b: Threshold current versus cavity length of typical gain and high gain GaN LD

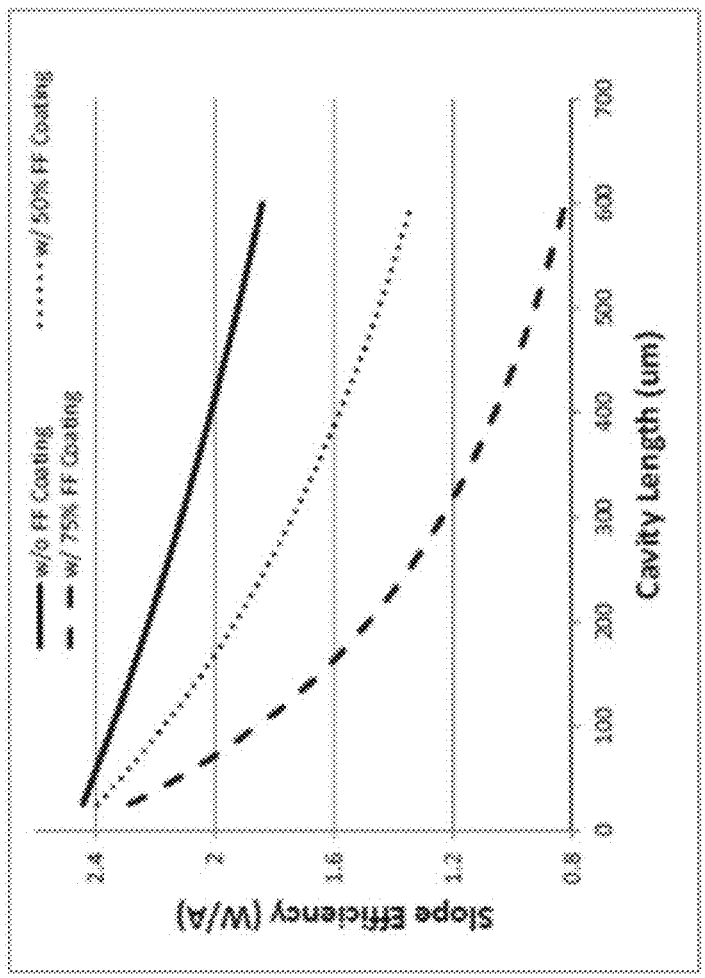
Figure 9: Slope efficiency versus cavity length of GaN LD

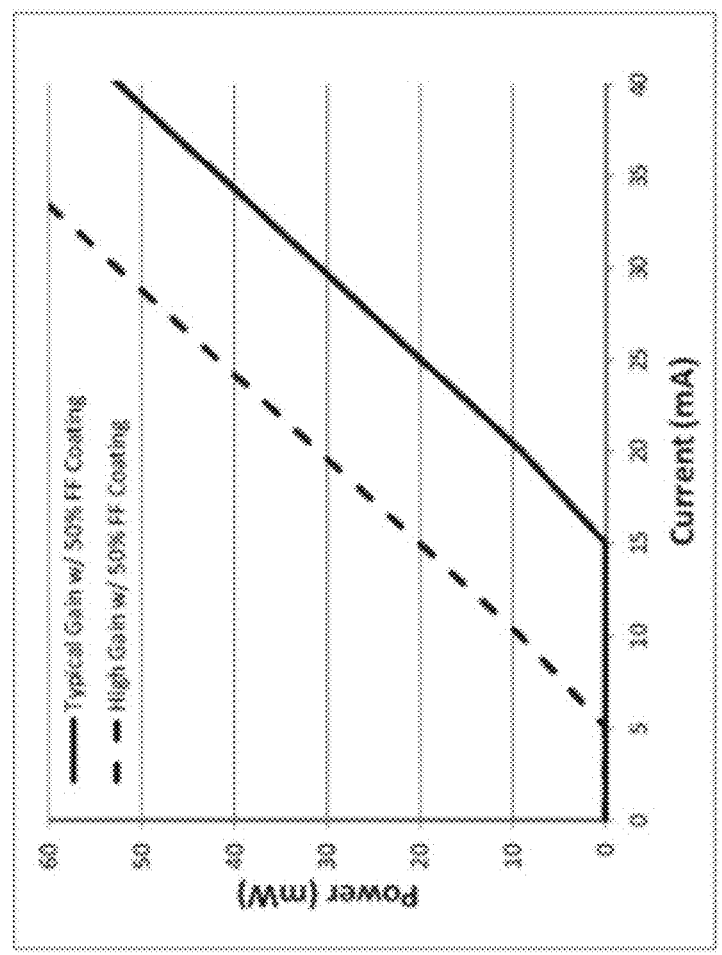
Figure 10: Output power versus current of typical gain and high gain GaN LD

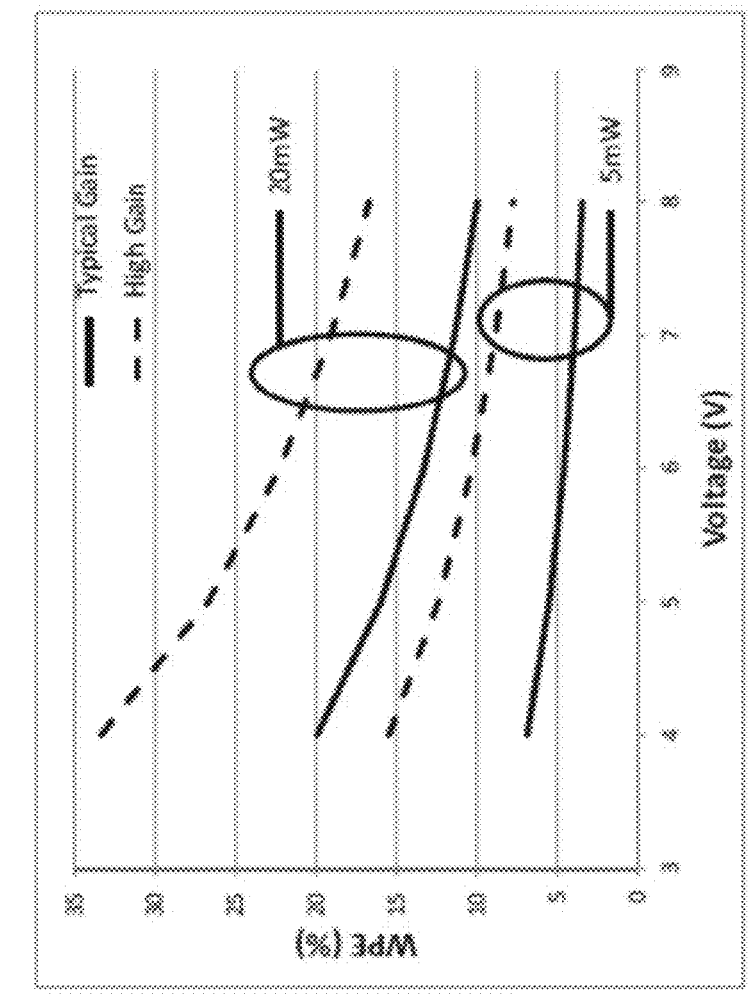
Figure 11: WPE versus voltage of typical gain and high gain GaN LD

Figure 11a: Modulation Response

- Relaxation resonance frequency $$\omega_R = \left(\frac{\Gamma v_g a}{qV} \eta_i (I - I_{th})\right)^{1/2}$$

- Maximize confinement ($\Gamma$): Enabled by NP/SP for several thick QWs
- Maximize differential gain ($a$): Enabled by NP/SP with 3-4x differential gain
- Minimize mode volume ($V = w \times l \times d$): Short cavity for small $l$, large $d$ offset by
- Maximize ($I - I_{th}$): High gain NP/SP with short cavity for low threshold current

- Electrical parasitics
  - *RC time constant*
    - $C$=capacitance driven by junction area, junction thickness, and contact pad
      - Short cavity with thick active region for low junction capacitance
      - Low k dielectric under contact pad for low pad capacitance

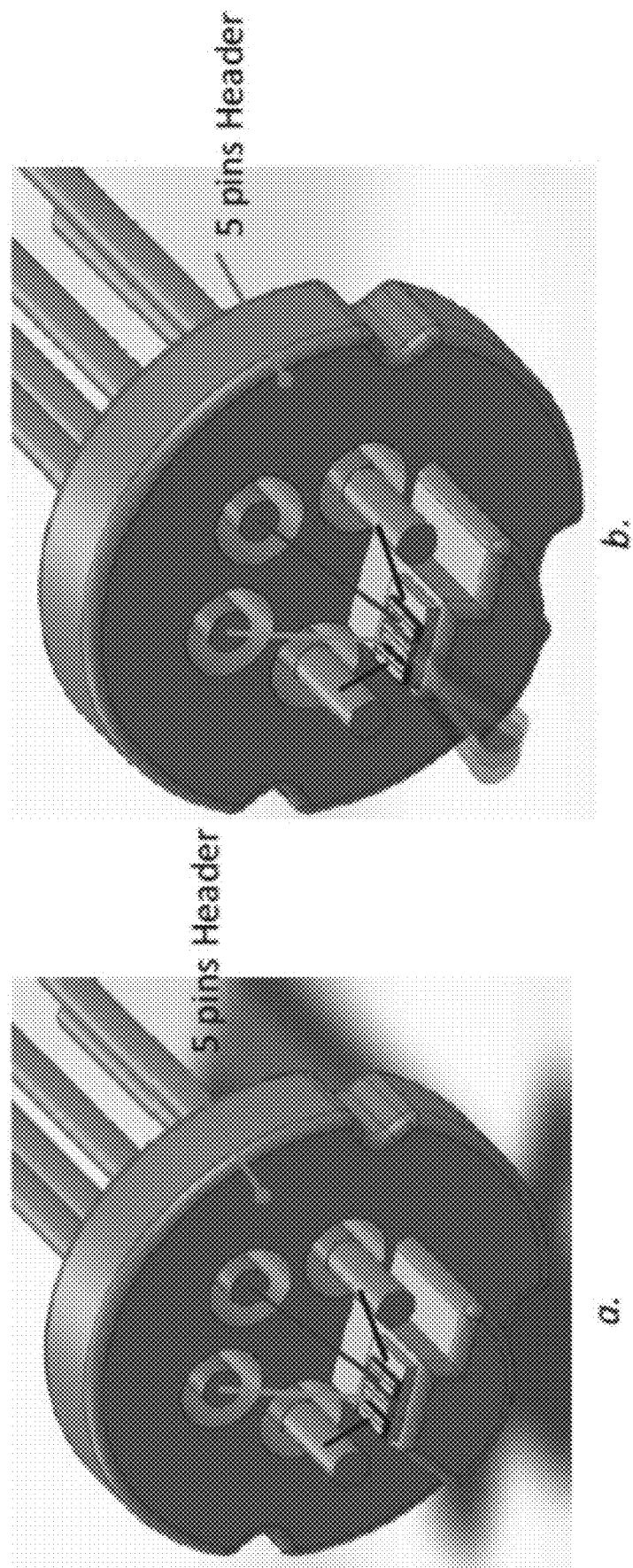
Figure 12 RGB TO can
Short cavity RGB laser diode chips mounted in conventional header package

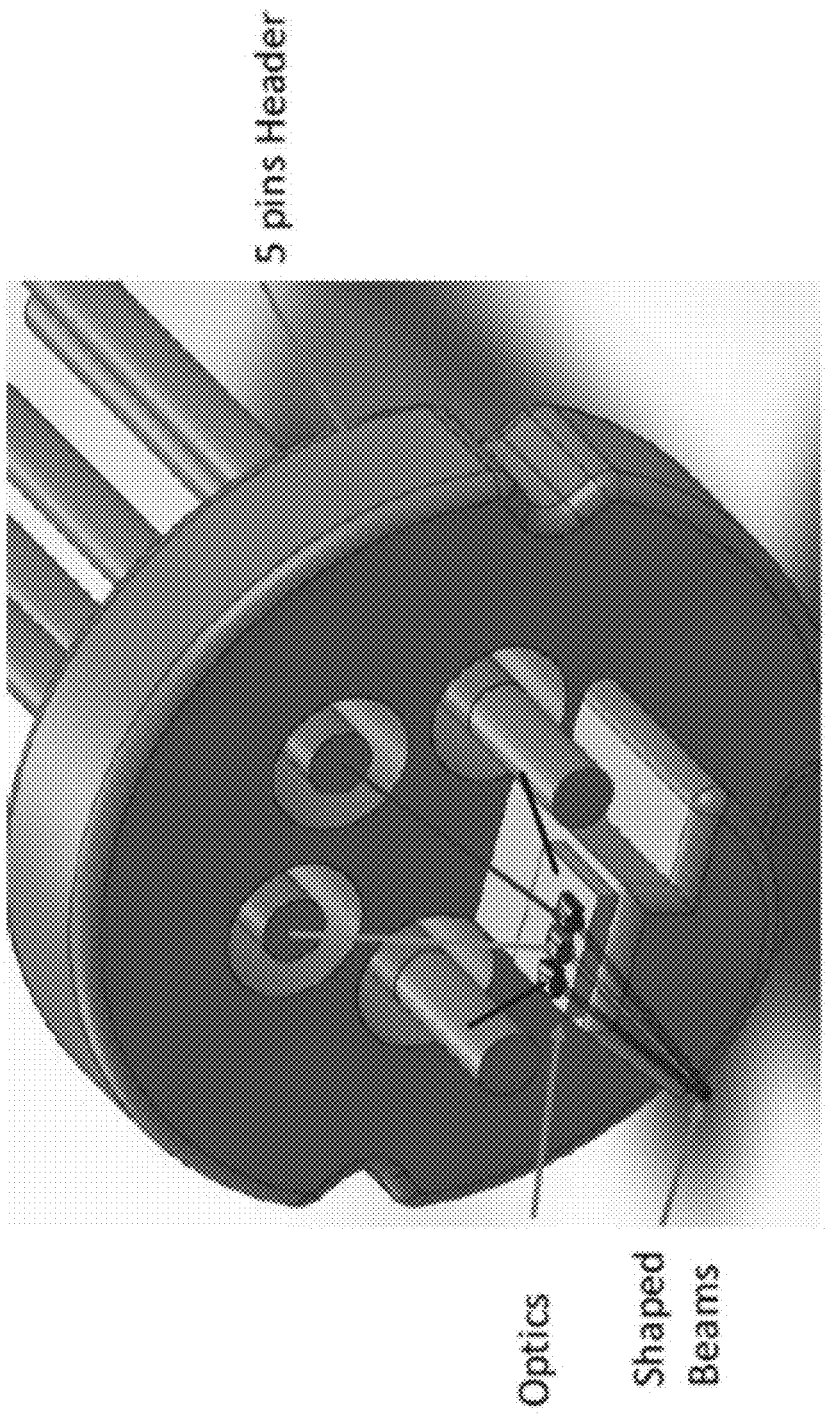
Figure 13: RGB TO can Short LD optic & Collimated beams

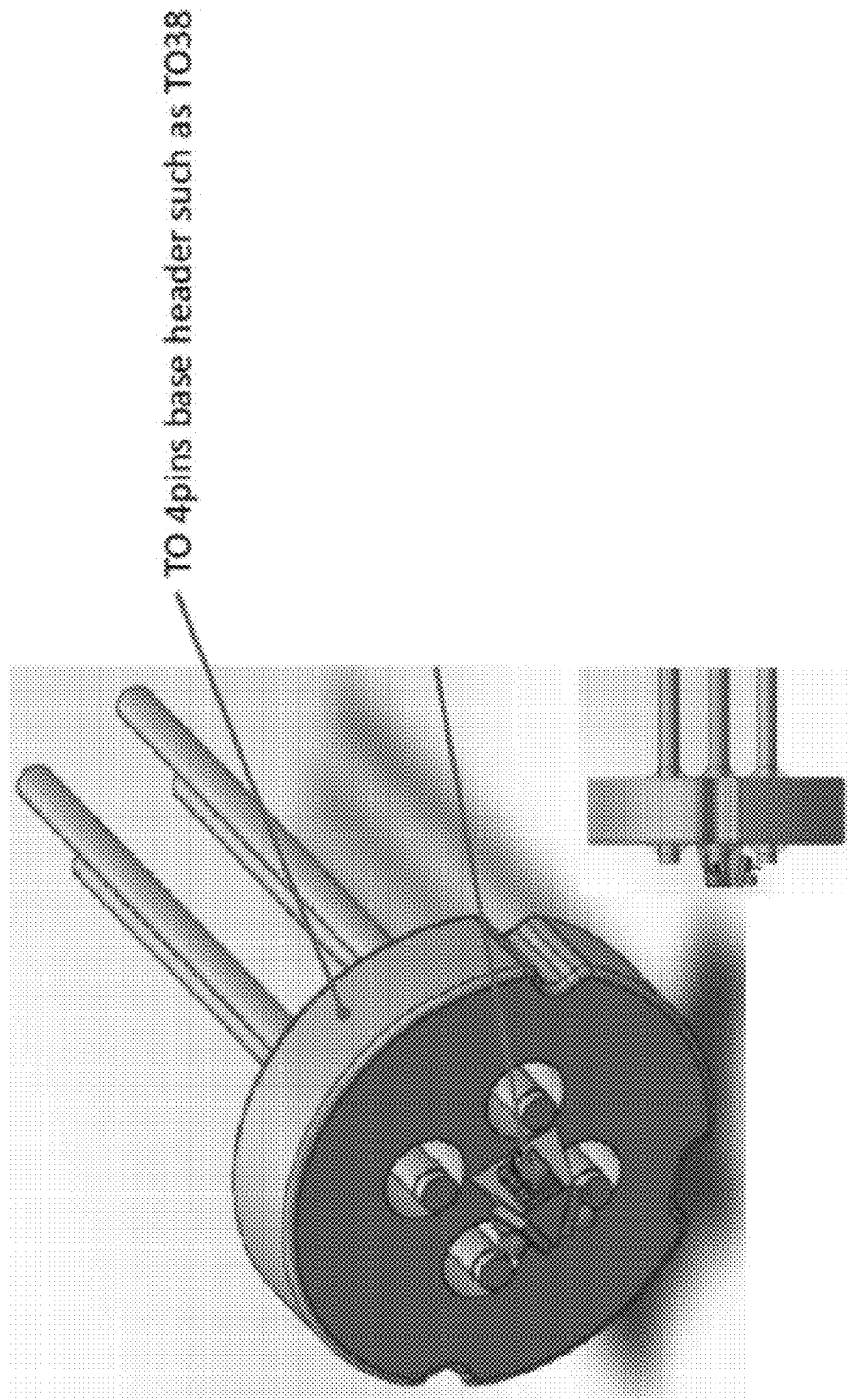
Figure 14: Special header design with shaped pedestal for RGB

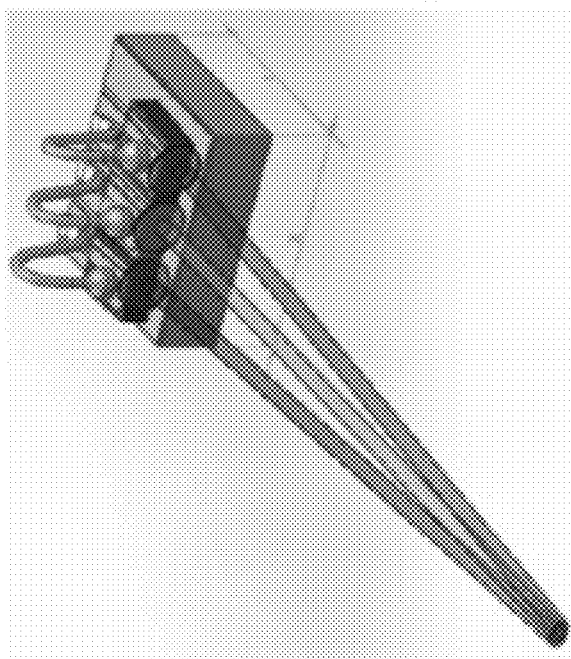
Figure 15: RGB micro module beam collimation

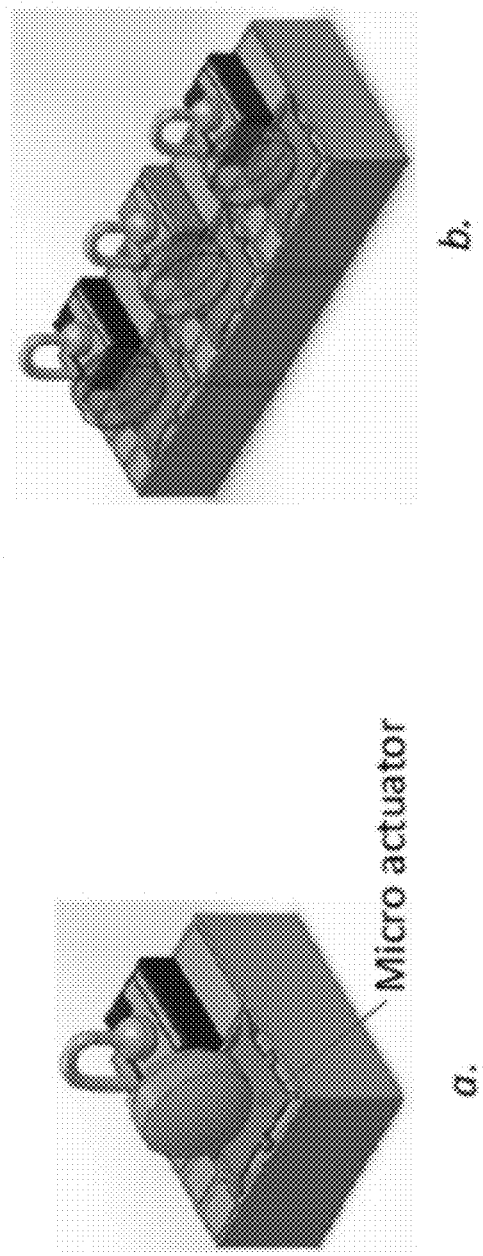
Figure 16: RGB Micro module optical coupling with micro-actuators

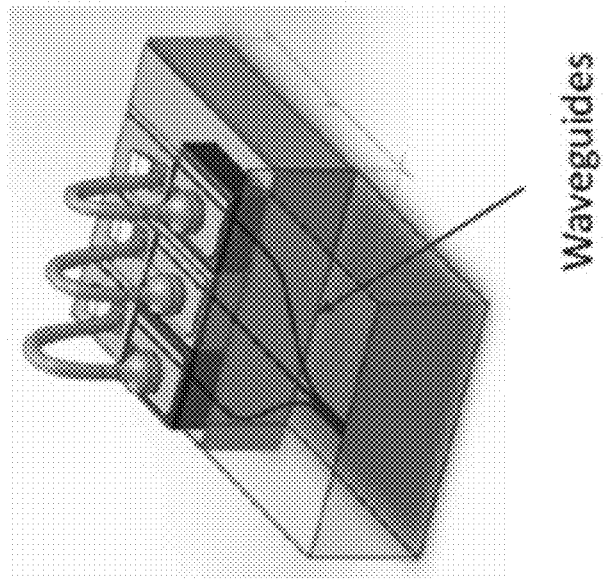
Figure 17: RGB Micro module w/ Waveguide for Beam Combining

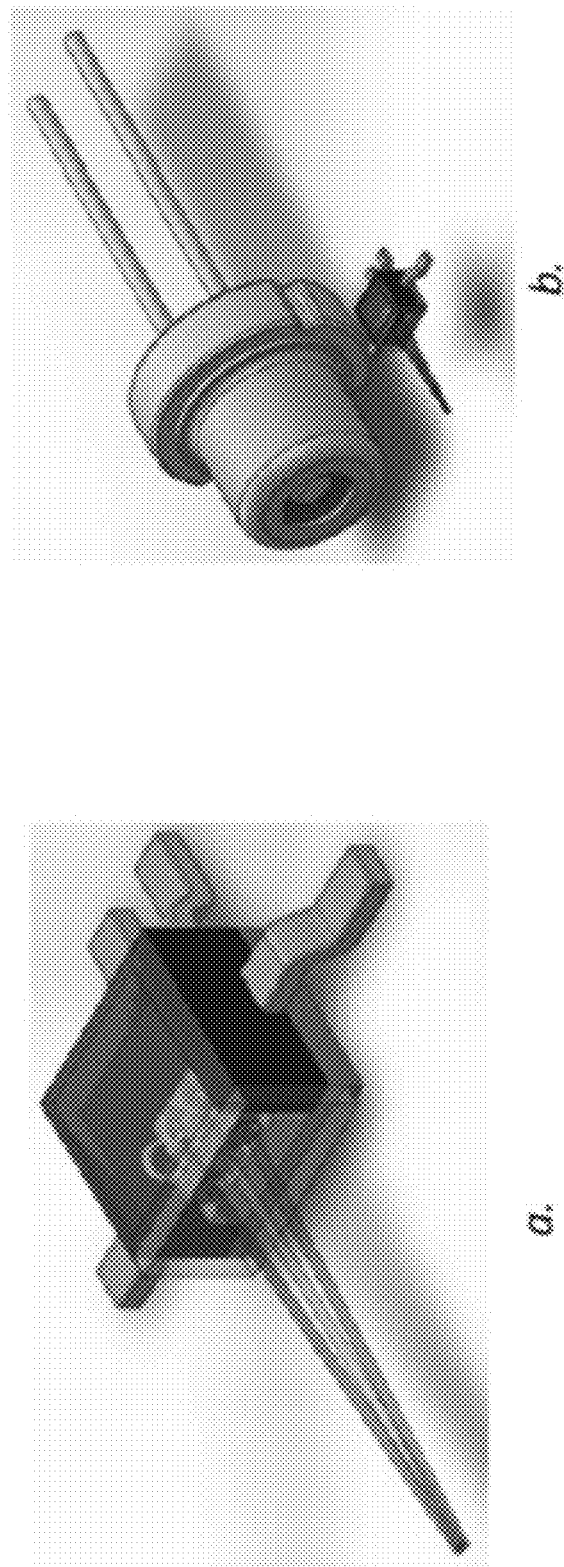
Figure 18: RGB Micro module

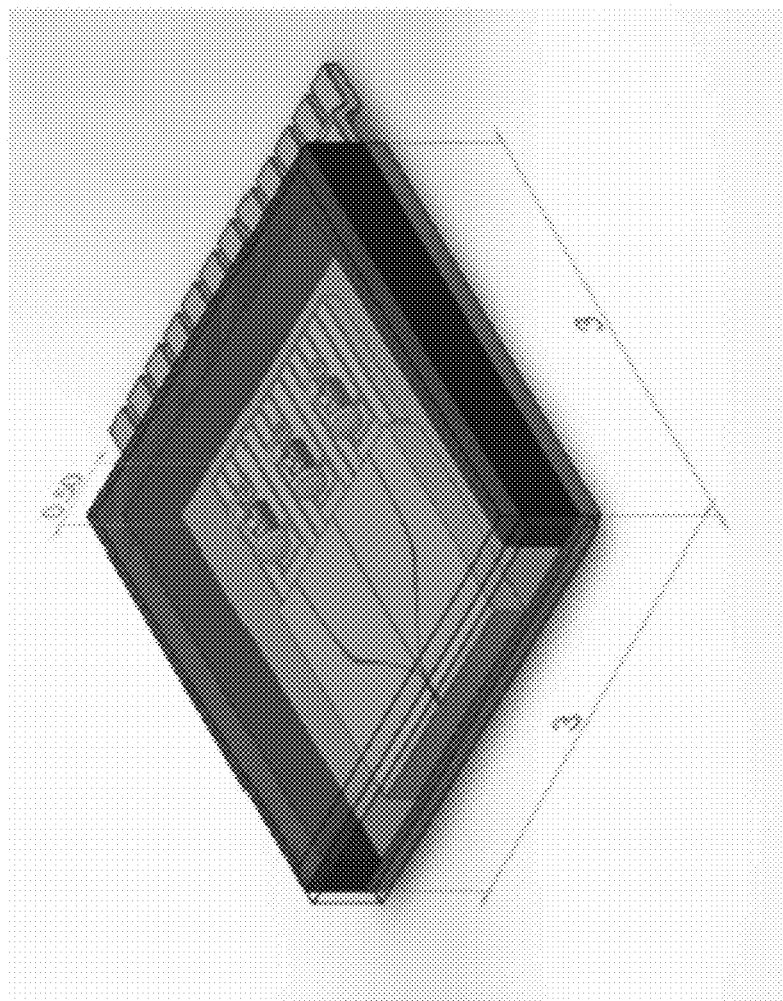
Figure 19: Example of RGB Micro module

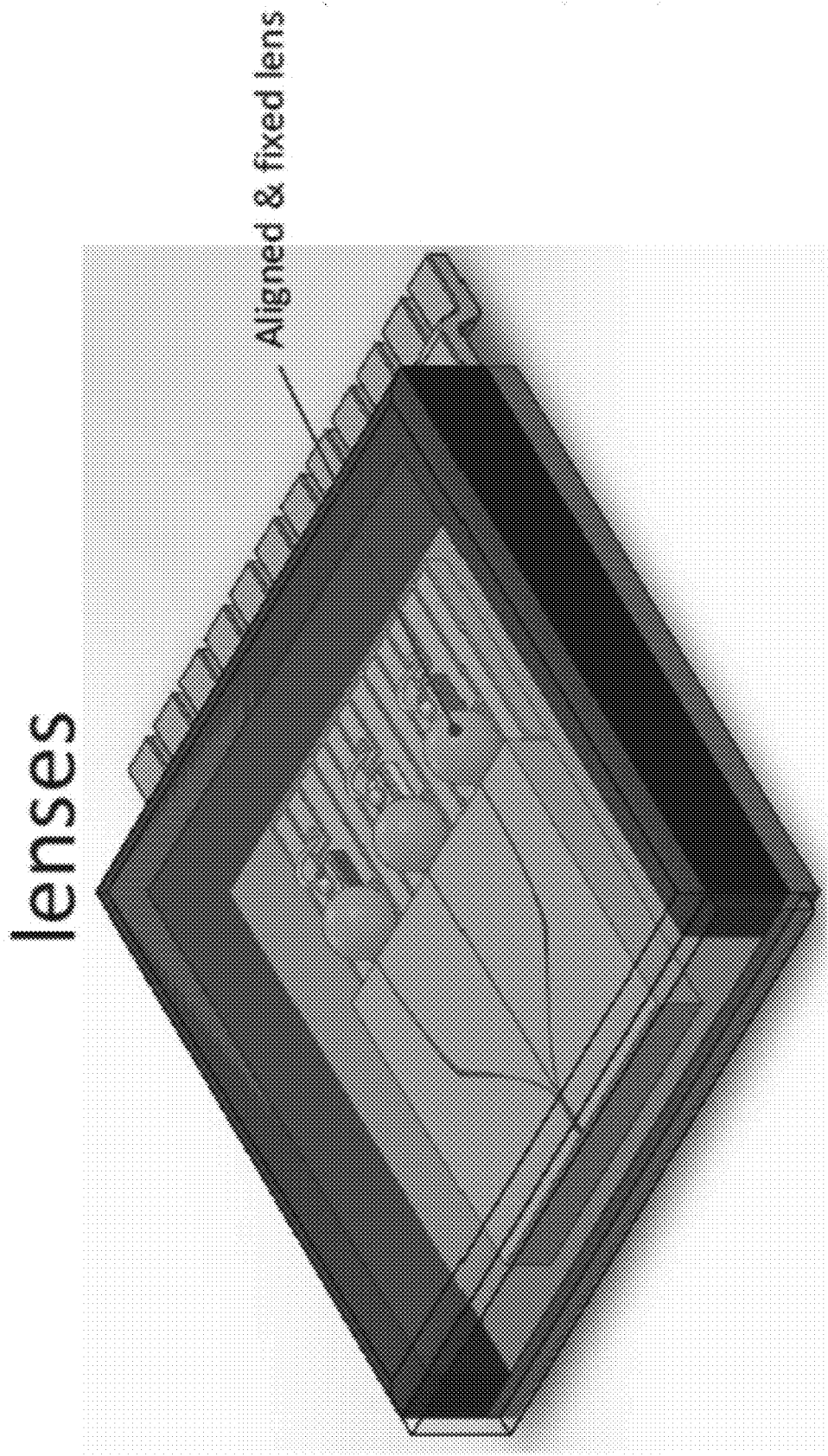
Figure 20: RGB micro module fix lenses — Aligned & fixed lens

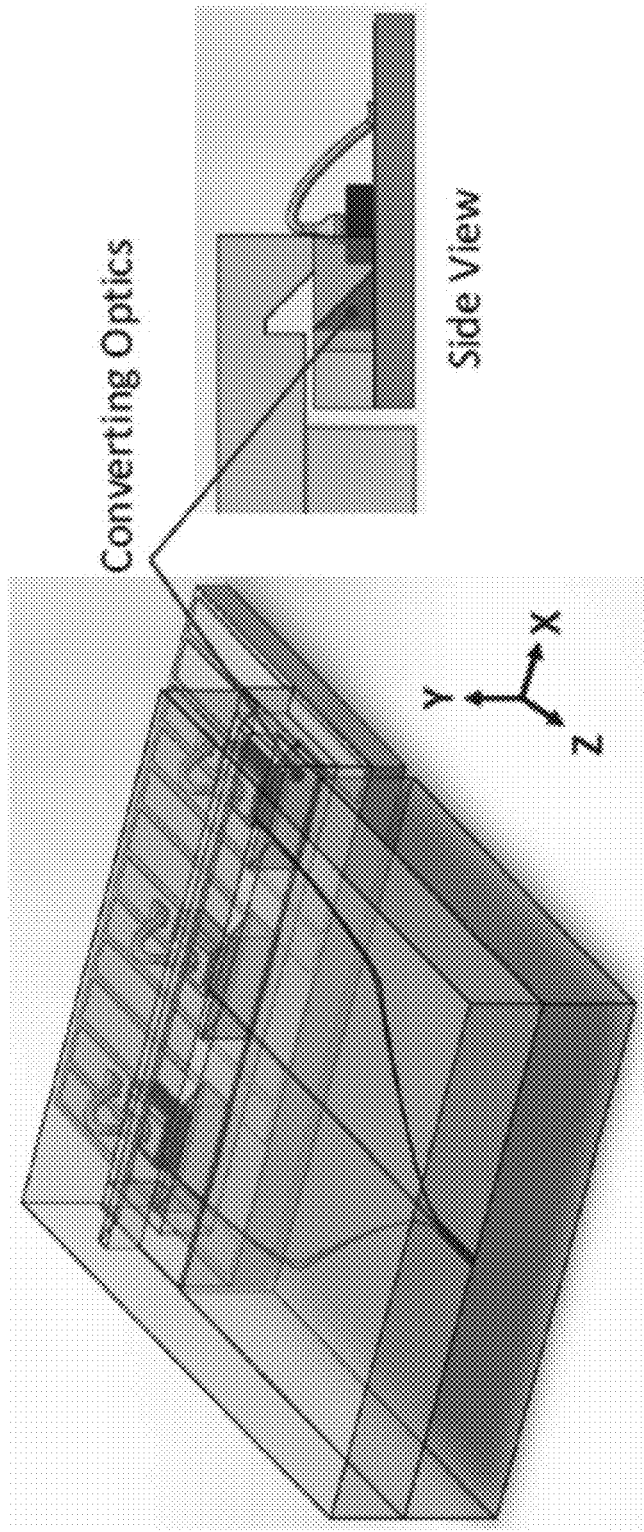
Figure 21: RGB Vertical coupling

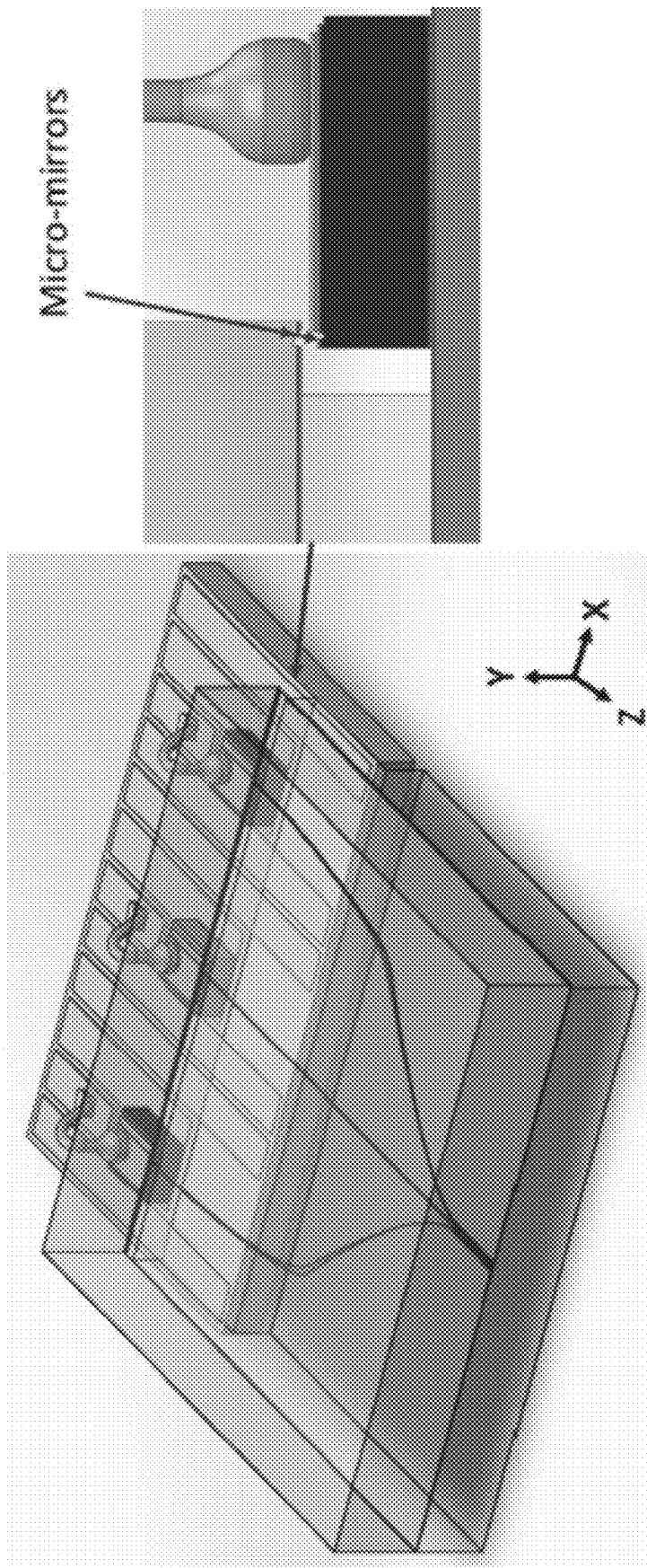
Figure 22: RGB Vertical coupling μfacets

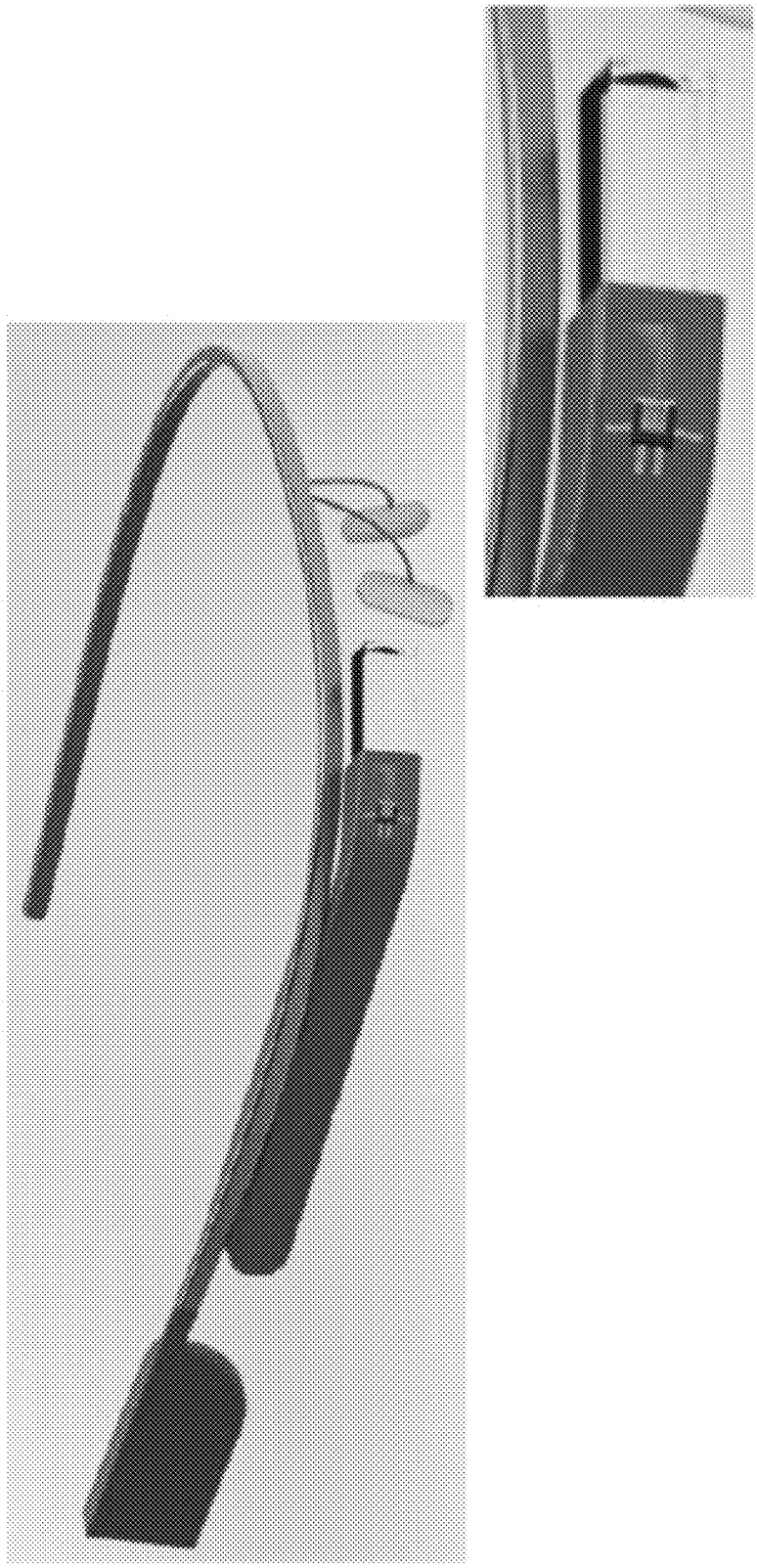
Figure 23: RGB micro module application example: Wearable display light source

| Feature | Google Glass | Epson Moverio BT200 | Vuzix M100 | Meta glasses 2 | Oculus Rift 2 |
|---|---|---|---|---|---|
| AR/VR | AR* | AR | AR* | AR | VR |
| CPU | 1GHz 2core | 1.2GHz 2core | 1.2GHz 2core | 1.5GHz | ns |
| RAM | 1GB | 1GB | 1GB | 4GB | ns |
| Display | 1 lens \| nHD | 2 lens \| qHD | 1 lens \| wqvga | 2 lens \| HD | 2 lens \| fHD |
| Im Size | 25" @ 2.5m | 40" @ 2.5m | 4" @ 0.4m | 95" @ 2.5m | ns |
| FoV | 14° | 23° | 15° | 40° | 100° |
| 📷 | 5Mpx \| HD | VGA | 5Mp \| fHD | Rgbd \| fHD | no |
| 🎤 | ✓ | no | ✓ | no | ns |
| ⌨ | no | ✓ | ? | ? | ns |
| 🛰 | ✓ | ✓ | ✓ | ✓ | ns |
| ✦ | ✓ | ✓ | ✓ | ✓ | ✓ |
| ⊗ | ✓ | ✓ | ✓ | ✓ | ✓ |
| 👜 | 42g | 88g | ? | 180g | 527g |
| Connection | Wifi \| blue | Wifi \| blue | Wifi \| blue | Wifi \| blue | no |
| Price | $1500 | $700 | $1000 | $3000 | $500 |

Figure 31

WEARABLE LASER BASED DISPLAY METHOD AND SYSTEM

CROSS-REFERENCES TO RELATED APPLICATIONS

The present application is a continuation application of U.S. patent application Ser. No. 15/913,674, filed Mar. 6, 2018, which is a divisional application of U.S. patent application Ser. No. 14/449,700, filed Aug. 1, 2014, which claims priority to U.S. Provisional Patent Application No. 61/889,955, filed Oct. 11, 2013, each of which are commonly assigned and hereby incorporated by reference herein.

The present application is also related to U.S. Provisional Patent Application No. 61/347,800, filed May 24, 2010, entitled "SYSTEM AND METHOD OF MULTI-WAVELENGTH LASER APPARATUS", which is incorporated by reference herein for all purposes. The present application additionally is related to U.S. Provisional Patent Application No. 61/345,561, filed May 17, 2010, entitled "METHOD AND SYSTEM FOR PROVIDING DIRECTIONAL LIGHT SOURCES WITH BROAD SPECTRUM", which is incorporated by reference herein for all purposes. This application is also related to U.S. patent application Ser. No. 12/749,466, filed Mar. 29, 2010, which is commonly assigned and incorporated by reference herein.

BACKGROUND

The present invention is directed to wearable augmented reality glasses incorporating projector systems display technologies with optical delivery to the eye using transparent waveguides. More specifically, various embodiments of the present invention provide projection display systems embedded into wearable glasses where one or more laser diodes and/or LEDs are used as light source for illustrating images with optical delivery to the eye using transparent waveguides. In one set of embodiments, the present invention provides wearable augmented reality glasses incorporating projector systems that utilize blue and/or green laser fabricated using gallium nitride containing material with optical delivery to the eye using transparent waveguides. In another set of embodiments, the present invention provides wearable augmented reality glasses incorporating projection systems having digital lighting processing engines illuminated by blue and/or green laser devices with optical delivery to the eye using transparent waveguides. In a specific embodiment, the present invention provides wearable augmented reality glasses incorporating a 3D display system with optical delivery to the eye using transparent waveguides. There are other embodiments as well.

Wearable augmented reality displays in glasses are becoming increasingly popular and are expected to gain further traction in the coming years. Substantial growth (e.g., over 40% CAGR) is projected for the coming several years for wearable displays, and consumers are developing use cases such as easily taking photos and video, showing instructions, directions, photos, video, or other data superimposed onto your field of view, hands free operation with voice commands, 3D gaming. As more viewing content is available via wearable devices such as TV, internet and video, displays in handheld consumer electronics remain small (<3") with the keyboard, camera, and other features competing for space and power.

Therefore, improved systems for displaying images and/or videos are desired, and wearable augmented reality displays in glasses are an ideal solution.

The market for augmented reality wearable displays (or AR glasses) is potentially huge. Some estimates say that in the not so distant future, AR glasses could be the user interface of choice and will gradually replace the conventional hand held smart-phone touchscreen interface. The target market therefore is the ubiquitous use of mobile video, navigation, augmented reality, and gaming. Smart-phones are capable of more functionality than ever before and telecoms operators are seeking to increase their non-voice based revenues by offering more services (video on demand, navigation, games, etc.). The major issue is that displays on mobile phones are not large enough (typically 3-4 inches in diagonal) in order to fully enable these new use models. See through wearable AR displays that don't obstruct the user's line of sight allow a non-intrusive, hands free, large screen experience and are therefore a desirable alternative allowing full use of the available computing power of smart devices. Wearable displays are compelling because they offer the ability to display video, navigation, messaging, augmented reality applications, and games on a large virtual screen hands free. However, any such device will need to be affordable and should have a form factor that is discrete enough so that users will easily adopt it. Since users do not "wear" mobile phones, the form factor challenges are different than with a wearable display device. Moreover, the device will need to have enough intelligence built into it in the form of sensors and video processing in order to make it useful for augmented reality, positioning, and gaming applications. If a wearable display device can hit the "sweet spot" of price, performance, and form factor, then it will enable this revolution.

SUMMARY

The present invention is directed to wearable display technologies which are transparent to everyday users and have low power consumption. More specifically, various embodiments of the present invention provide wearable augmented reality projection display systems in glasses where one or more laser diodes are used as light source for illustrating images with optical delivery to the eye using transparent waveguides. In one set of embodiments, the present invention provides wearable augmented reality projector systems in glasses that utilize blue and/or green laser fabricated using gallium nitride containing material with optical delivery to the eye using transparent waveguides. In another set of embodiments, the present invention provides wearable augmented reality projection systems having digital lighting processing engines illuminated by blue and/or green laser devices with optical delivery to the eye using transparent waveguides. There are other embodiments as well.

In an example, the present invention provides an apparatus to be configured on a human head for images. The apparatus has a frame member configured to fit on the head of a human being. The apparatus has a display region coupled to the frame member and spatially disposed to allow the human user to view the display and a laser diode source. The device also has a wave guide structure having a first region and a second region, the first region being coupled to the display region, and the second region being coupled to the laser diode source, and configured to traverse electromagnetic radiation from the laser diode source through the wave guide structure to cause an image to be outputting on the display.

According to an embodiment, the present invention provides a wearable augmented reality projection system in glasses with optical delivery to the eye using transparent waveguides. The projection system includes an interface for receiving video. The system also includes an image processor for processing the video. The system includes a light source including a plurality of laser diodes. The plurality of laser diodes includes a blue laser diode. The blue laser diode is fabricated on non-polar oriented gallium nitride material. The system includes a power source electrically coupled to the light source. Optical delivery to the eye occurs using transparent waveguides such as diffraction optics, holographic optics, polarized optics, and/or reflective optics.

According to another embodiment, the present invention provides a wearable augmented reality projection system in glasses. The system includes an interface for receiving video. The system also includes an image processor for processing the video. The system includes a light source including a plurality of laser diodes. The plurality of laser diodes includes a blue laser diode. The blue laser diode is fabricated on semi-polar oriented gallium nitride material. The system also includes a power source electrically coupled to the light source. Optical delivery to the eye occurs using transparent waveguides such as diffraction optics, holographic optics, polarized optics, and/or reflective optics.

According to an embodiment, the present invention provides a wearable augmented reality projection apparatus in glasses. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror. Optical delivery to the eye occurs using transparent waveguides such as diffraction optics, holographic optics, polarized optics, and/or reflective optics.

According to an embodiment, the present invention provides wearable augmented reality projection apparatus in glasses. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. In this embodiment, the blue and the green laser diode would share the same substrate. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a MEMS scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror. Optical delivery to the eye occurs using transparent waveguides such as diffraction optics, holographic optics, polarized optics, and/or reflective optics.

According to an embodiment, the present invention provides a wearable augmented reality projection apparatus in glasses. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. In this embodiment, two or more of the different color lasers would be packaged together in the same enclosure. In this copackaging embodiment, the outputs from the blue, green, and red laser diodes would be combined into a single beam. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to another embodiment, the present invention provides a wearable augmented reality projection apparatus in glasses. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus includes a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam. Optical delivery to the eye occurs using transparent waveguides such as diffraction optics, holographic optics, polarized optics, and/or reflective optics.

According to another embodiment, the present invention provides a wearable augmented reality projection apparatus in glasses. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a digital light processing chip (DLP) comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam. Optical delivery to the eye occurs using transparent waveguides such as diffraction optics, holographic optics, polarized optics, and/or reflective optics.

According to another embodiment, the present invention provides a wearable augmented reality projection apparatus in glasses. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a liquid crystal display generating chip such as liquid crystal on silicon (LCOS), comprising a liquid crystal device. The liquid crystal device includes a plurality of pixels, corresponding to one or more pixels of the one or more frames of images. The color beams are respectively projected onto the liquid crystal devices. The apparatus includes a power source electrically coupled to the laser sources and the liquid crystal chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam. Optical delivery to the eye occurs using transparent waveguides such as diffraction optics, holographic optics, polarized optics, and/or reflective optics.

According to another embodiment, the present invention provides a wearable augmented reality projection apparatus in glasses. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a liquid crystal display generating chip such as liquid crystal on silicon (LCOS), comprising three liquid crystal devices. Each of the liquid crystal devices includes a plurality of pixels, corresponding to one or more pixels of the one or more frames of images. The color beams are respectively projected onto the liquid crystal devices. The apparatus includes a power source electrically coupled to the laser sources and the liquid crystal chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam. Optical delivery to the eye occurs using transparent waveguides such as diffraction optics, holographic optics, polarized optics, and/or reflective optics.

As an example, the wearable augmented reality projection apparatus in glasses may include a phosphor plate which may include phosphor material that modifies the color of light emitted from the light source. In a specific embodiment, the phosphor plate includes multiple regions, each of the regions corresponding to a specific color (e.g., red, green, blue, etc.). In an exemplary embodiment, a projector includes a light source that includes blue and red light sources. The phosphor plate includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the phosphor plate, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and phosphor plates thereof.

As another example, the phosphor plate may include multiple phosphor materials. For example, the phosphor plate may include both green and red phosphors in combination with a blue light source. In a specific embodiment, the phosphor plate includes multiple regions, each of the regions corresponding to a specific color (e.g., red, green, blue, etc.). In an exemplary embodiment, a projector includes a light source that includes a blue light source. The phosphor plate includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the phosphor plate, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and phosphor plates thereof.

As another example, the phosphor plate may include blue, green, and red phosphor materials. For example, the phosphor plate may include blue, green and red phosphors in combination with a ultra-violet (UV) light source. In a specific embodiment, phosphor plate includes multiple regions, each of the regions corresponding to a specific color (e.g., red, green, blue, etc.). In an exemplary embodiment, a projector includes a light source that includes a UV light source. The phosphor plate includes three phosphor containing regions for converting UV light to blue light, UV light to green light, and UV light and to red light, respectively. In operation, the phosphor plate emits blue, green, and red light from the phosphor containing regions in sequence. The blue, green and red light from the phosphor may be transmitted through the phosphor plate, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and phosphor plates thereof.

According to yet another embodiment, the present invention provides a wearable augmented reality projection apparatus in glasses. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The green laser diode has a wavelength of about 490 nm to 540 nm. The laser source is configured produce a laser beam by coming outputs from the blue, green, and red laser diodes. The apparatus includes a digital light processing chip comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam. Optical delivery to the eye occurs using transparent waveguides such as diffraction optics, holographic optics, polarized optics, and/or reflective optics.

As an example, the phosphor plate may include phosphor material that modifies the color of light emitted from the light source. In a specific embodiment, the phosphor plate includes multiple regions, each of the regions corresponding to a specific color (e.g., red, green, blue, etc.). In an exemplary embodiment, a projector includes a light source that includes blue and red light sources. The phosphor plate includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the phosphor plate, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and phosphor plates thereof.

As another example, the phosphor plate may include multiple phosphor materials. For example, the phosphor plate may include both green and red phosphors in combination with a blue light source. In a specific embodiment, the phosphor plate includes multiple regions, each of the regions corresponding to a specific color (e.g., red, green, blue, etc.). In an exemplary embodiment, a projector includes a light source that includes a blue light source. The phosphor plate includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the phosphor plate, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and phosphor plates thereof.

As another example, the phosphor plate may include blue, green, and red phosphor materials. For example, the phosphor plate may include blue, green and red phosphors in combination with a ultra-violet (UV) light source. In a specific embodiment, phosphor plate includes multiple regions, each of the regions corresponding to a specific color (e.g., red, green, blue, etc.). In an exemplary embodiment, a projector includes a light source that includes a UV light source. The phosphor plate includes three phosphor containing regions for converting UV light to blue light, UV light to green light, and UV light and to red light, respectively. In operation, the phosphor plate emits blue, green, and red light from the phosphor containing regions in sequence. The blue, green and red light from the phosphor may be transmitted through the phosphor plate, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and phosphor plates thereof.

Various benefits are achieved over pre-existing techniques using the present invention. Pre-existing wearable glasses suffer from being quite noticeable and distracting to everyday users. Additionally, power consumption is quite high, and images are dim and small. The present invention enables a transparent, efficient cost-effective projection systems that utilizes efficient light sources. In a specific embodiment, the light source can be manufactured in a relatively simple and cost effective manner. Additionally, waveguide based techniques are the most effective technologies for wearable displays since they reduce the cumbersome display optics and electronics in front of the user's face and in the user's line of sight. Using a waveguide, the physical display and electronics can be moved to the side (near the user's temples) and a fully unobstructed view of the world can be achieved, therefore opening up the possibilities to true augmented reality experiences. Using waveguide optics with laser sources is particularly effective since bright images can be achieved in transparent glasses with low power consumption. This is because the narrow spectrum of the laser light can be directed into the eye to produce bright images, while the ambient broadband spectra from the surrounding environment can also pass through as well with minimal optical loss. Moreover, because of lasers spatial brightness, their optical throughput through the projection display components and optical delivery system can be extremely high, more than 10× higher than LEDs for example. Additionally, using semipolar laser diodes which have higher up to 300% higher gain, miniature chips can be used which reduces cost and also reduces the operating current for low power operation. This means that the chip cost can be ⅓, and the electrical to optical efficiency of the lasers in the system can be much higher than with C-plane laser diodes.

These benefits are summarized here:
Viewing of bright images though transparent eye-glasses: Laser displays (especially semi polar LDs) and ultra thin waveguide delivery to the eye enables discreet and transparent viewing of bright images without bulky and distracting optics. RGB lasers have narrow spectrum and can produce bright full color images that are transported with ultra-thin waveguides and directed into the eye at those particular RGB wavelengths, while still having fully transparent eye-glasses functionality that allows nearly all of the ambient light through from the remainder of the visible spectrum.

Low power consumption: Semi-polar LDs have high gain, and therefore can be fabricated as a very short chip, (i.e. 200 microns or less), which enables ultra-low threshold current (i.e. below 10 mA) and high efficiency at low optical power. Moreover, due to the lasers narrow spectrum and excellent spatial brightness, the optical throughput through the display engine and waveguide optical system can be several times higher than LEDs or other light sources.

Low cost: Semi-polar LDs have high gain, and therefore can enable chip sizes that are several times smaller, enabling lower costs and smaller form factor. Moreover, lasers can be coupled to thin waveguides with high efficiency, and therefore the thickness of the waveguides can be as small as possible and cost can be minimized (i.e. much smaller than 1 cm).

Compact form factor: Semi-polar LDs have high gain, and therefore can enable chip sizes that are several times smaller, enabling smallest possible form factor. Moreover, lasers can be coupled to thin waveguides with high efficiency, and therefore the thickness of the waveguides can be as small as possible (i.e. much smaller than 1 cm), and form factor can be minimal.

Depending upon the embodiment, the present apparatus and method can be manufactured using conventional materials and/or methods according to one of ordinary skill in the art. In one or more embodiments, the laser device is capable of multiple wavelengths. Of course, there can be other variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1 is a simplified schematic diagram of semipolar laser diode with the cavity aligned in the projection of c-direction with cleaved or etched mirrors according to examples of the present invention.

FIG. 2 is a simplified schematic cross-sectional diagram illustrating a laser diode structure according to an example of the present invention.

FIG. 3 is an example of a conventional laser diode illustrated with a short cavity laser diode.

FIG. 4 plots the relationship of chip count versus cavity length for a 2 inch substrate assuming a chip width of 150 um and a substrate utilization of 80% in an example.

FIG. 5 presents simulations of the threshold gain versus cavity length for edge emitting GaN-based lasers with an assumed internal loss of 5 cm-1 in an example.

FIG. 6 presents an example of simulated gain dependence on current density for blue LDs fabricated on a c-plane orientation with a typical modal differential gain (solid, 7 cm-1/(kA/cm2)) versus those fabricated on NP/SP with a high differential modal gain of 20 cm-1/(kA/cm2).

FIGS. 7*a* and 7*b* present examples of simulated threshold current density dependence on laser cavity length for typical c-plane (solid) blue laser designs versus improved NP/SP (dashed) blue laser designs assuming the gain characteristics of the Figures.

FIGS. 8*a* and 8*b* presents examples of simulated threshold current dependence on laser cavity length for typical c-plane (solid) blue laser designs versus improved NP/SP (dashed) blue laser designs assuming the gain characteristics of the Figures.

FIG. 9 plots an example of slope efficiency (W/A) versus cavity lengths assuming an internal loss of 5 cm-1 and a rear facet reflectivity of 99% for the cases of an uncoated front facet, a front facet with a 50% reflective coating, and a front facet with a 75% reflective coating.

FIG. 10 plots the simulated LI curves for blue LDs fabricated on the typical gain versus those with high gain where the front facet is coated for a ~50% reflectivity, and the cavity is 100 um long by 1.5 um wide.

FIG. 11 presents the simulated curves of WPE versus voltage at 5 mW and 20 mW output power for blue LDs fabricated on the typical gain c-plane orientations versus those fabricated on high gain NP/SP orientations where the front facet is coated for a ~50% reflectivity, and the cavity is 100 um long by 1.5 um wide.

FIG. 11(a) illustrates a relationship for modulation frequency response according to an example.

FIG. 12 is an example of a conventional TO-Can type package with R-G-B laser chips all mounted on the same pedestal.

FIG. 13 is an RGB TO-can configured with short laser optic and collimated beams according to an example.

FIG. 14 shows modified TO-can type package with a unique triangular pedestal design such that the three R-G-B laser chips are each mounted on one side of the pedestal.

FIG. 15 presents R-G-B short cavity laser chips mounted on a common carrier (submount) with the laser beams collimated using optics mounted near the laser aperture.

FIG. 16 presents an example of single laser diode chip mounted on carrier with micro-actuator for optical alignment and coupling and FIG. 16b RGB laser diode chips mounted on carriers with micro-actuators for alignment and coupling.

FIG. 17 presents an example of R-G-B laser diode chips mounted on carriers and then coupled into a glass waveguide for beam combination.

FIG. 18 provides (a) an example of a fully enclosed micro RGB module where form factor could range from 0.5-4 mm wide, 0.5-4 mm long, and 0.5 to 4 mm tall; and (b) a miniature these RGB modules are by comparing a micro module form factor to a conventional TO38 package form factor.

FIG. 19 is an example of miniature RGB laser module with dimensions of 3 mm×3 mm×0.5 mm. In this example configuration the laser diodes output beams are fed through lenses for beam collimation, which are aligned by micro-actuators. The collimated beams are then coupled into a waveguide beam combining device for an output RGB beam.

FIG. 20 is an RGB module configured with a fixed lens according to an example.

FIG. 21 is an RGB module vertically coupled according to an example.

FIG. 22 is an RGB module vertically coupled according to an example.

FIG. 23 is an RGB module configured on a wearable display.

FIG. 31 is a comparison of various wearable glasses incorporating projection display systems. These products suffer from being highly distracting and have high power consumption, and do not offer bright images in the form factor of transparent discreet eye-glasses.

DETAILED DESCRIPTION

Figure 24:
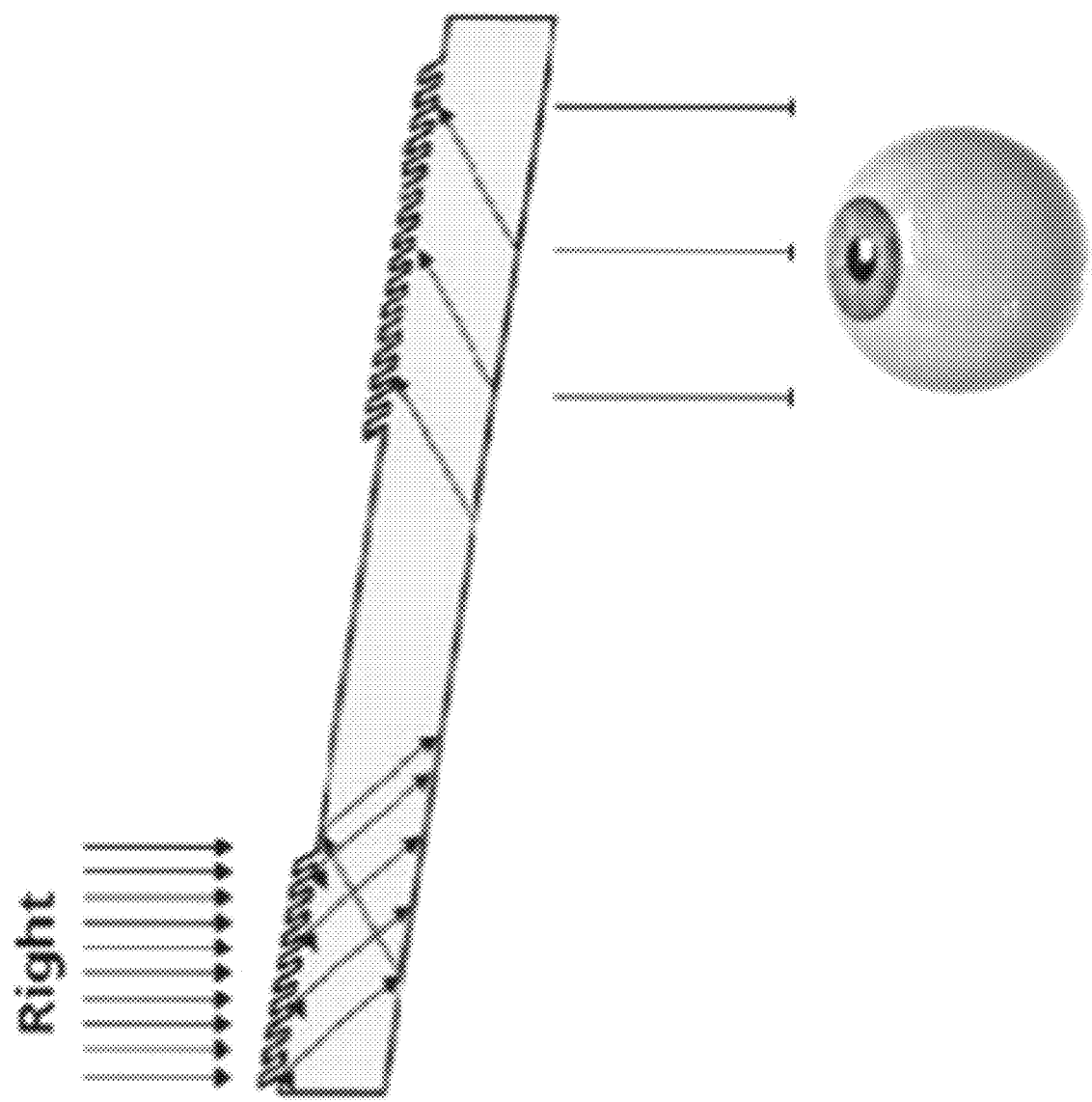
FIG. 24 is a simplified diagram illustrating a wearable augmented reality glasses incorporating projection display systems using diffractive waveguide to deliver the image to the eye.

The present disclosure relates generally to optical techniques. More specifically, the present disclosure provides methods and devices using nonpolar, semi-polar, or polar c-plane oriented gallium and nitrogen containing substrates for optical applications. More particularly, in a semipolar embodiment the present invention provides a method and device using a gallium and nitrogen containing substrate configured on the {20-21} family of planes or an off-cut of the {20-21} family of planes towards the plus or minus c-plane and/or towards the a-plane according to one or more embodiments, but there can be other configurations. Such family of planes include, but are not limited to, (30-3-2), (20-2-1), (30-3-1), (30-32), (20-21), (30-31) or any orientation within +/−10 degrees towards c-plane and/or a-plane from these orientations. In particular, the present invention provides a method and device for emitting electromagnetic radiation using nonpolar or semipolar gallium containing substrates such as GaN, AlN, InN, InGaN, AlGaN, and AlInGaN, and others. The invention can be applied to optical devices, lasers, light emitting diodes, solar cells, photoelectrochemical water splitting and hydrogen generation, photodetectors, integrated circuits, and transistors.

With the emergence of green laser diodes and breakthrough display technologies such as scanning micro-mirrors an explosive market for display systems based on red, green, and blue (RGB) laser diodes is inevitable. A large portion of these explosive markets will be driven by small projection apparatuses in applications such as pico projection from phones and other devices along with even lower power/smaller applications such as Google glasses for projection onto a lens or even direct retina scanning. To best serve such applications the laser diodes should operate with high efficiency for low power consumption and long battery life, have a low cost structure to enable high volume consumer electronic applications, have a high 3 dB modulation bandwidth to enable driving schemes providing the best and most efficient image generation, and have a very small form factor to enable miniature light engines suitable for compact devices such as Google glasses, smart phones, smart watches, etc. The invention disclosed here addresses these requirements using red, green, and blue ultra-short cavity in-plane laser diodes. Cleaving techniques used for the fabrication of conventional in-plane laser diodes used in these applications limit the cavity length to greater than about 350 um and more realistically to 450 um. This is especially true in the GaN system due to the difficulty in achieving high quality cleaved facets, yield, and handling considerations.

As an example, FIG. 1 is a simplified schematic diagram of semipolar laser diode with the cavity aligned in the projection of c-direction with cleaved or etched mirrors. Example of projection of c-direction oriented laser diode stripe on semipolar (30-3-1) substrate with cleaved or etched mirrors. This diagram is merely an example, which should not unduly limit the scope of the claims herein. One of ordinary skill in the art would recognize other variations, modifications, and alternatives. As shown, the optical device includes a gallium nitride substrate member having a semipolar crystalline surface region characterized by an orientation of about 9 degrees to about 12.5 degrees towards (000-1) from the m-plane.). In an embodiment, the gallium nitride substrate member is a bulk GaN substrate characterized by having a semipolar crystalline surface region, but can be others. In an embodiment, the bulk GaN substrate has a surface dislocation density below $10^5$ cm$^{-2}$ or $10^5$ to $10^7$ cm$^{-2}$. It should be noted that homoepitaxial growth on bulk GaN is generally better than hetero-epitaxy growth. The nitride crystal or wafer may comprise $Al_xIn_yGa_{1-x-y}N$, where $0 \leq x, y, x+y \leq 1$. In an embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$ or below about $10^7$ cm$^{-2}$ others such as those ranging from about $10^5$-$10^8$ cm$^{-2}$. In alternative example, is a projection of the c-direction oriented laser diode stripe on semipolar (20-21) substrate with cleaved or etched mirrors. The optical device includes a gallium nitride substrate member having a semipolar crystalline surface region characterized by an orientation of about 13 degrees to about 17 degrees towards (0001) from the m-plane.). In an embodiment, the gallium nitride substrate member is a bulk GaN substrate characterized by having a semipolar crystalline surface region, but can be others. In an embodiment, the bulk GaN substrate has a surface dislocation density below $10^5$ cm$^{-2}$ or $10^5$ to $10^7$ cm$^{-2}$.

In an embodiment, the device has a laser stripe region formed overlying a portion of the semipolar crystalline orientation surface region. In an embodiment, the laser stripe region is characterized by a cavity orientation that is substantially parallel to the projection of the c-direction. In an embodiment, the laser stripe region has a first end and a second end.

In an embodiment, the device has a first facet provided on the first end of the laser stripe region and a second facet provided on the second end of the laser stripe region. In one or more embodiments, the first facet is substantially parallel with the second facet. Mirror surfaces are formed on each of the surfaces. The first facet comprises a first mirror surface. In an embodiment, the first mirror surface is provided by a scribing and breaking process or alternatively by etching techniques using etching technologies such as reactive ion etching (ME), inductively coupled plasma etching (ICP), or chemical assisted ion beam etching (CAIBE), or other method. Any suitable scribing process can be used, such as a diamond scribe or laser scribe or combinations. In an embodiment, the first mirror surface comprises a reflective coating. In an embodiment, the reflective coating can be deposited using, for example, e-beam evaporation, thermal evaporation, RF sputtering, DC sputtering, ECR sputtering, ion beam deposition, Ion Assisted Deposition, reactive ion plating, any combinations, and the like. In still other embodiments, surface passivation may be used to the exposed surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Additionally, the facets can be cleaved or etched or a combination of them.

Also in an embodiment, the second facet comprises a second mirror surface. The second mirror surface is provided by a scribing and breaking process according to an embodiment or alternatively by etching techniques using etching technologies such as reactive ion etching (ME), inductively coupled plasma etching (ICP), or chemical assisted ion beam etching (CAIBE), or other method. Preferably, the scribing is diamond scribed or laser scribed or the like. In an embodiment, the second mirror surface comprises a reflective coating, such as silicon dioxide, hafnia, titania, tantalum pentoxide, zirconia, aluminum oxide, combinations, and the like. In an embodiment, the second mirror surface comprises an anti-reflective coating, such alumina or aluminum oxide. In an embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed surface prior to coating.

In an embodiment, the laser stripe has a length and width. The length ranges from about 20 microns to about 500 microns or about 500 microns to about 1500 microns. The stripe also has a width ranging from about 0.5 microns to about 50 microns, but can be other dimensions. In an embodiment, the stripe can also be about 3 to 35 microns wide for a high power multi-lateral-mode device or about 1 to 2 microns for a single lateral mode laser device. In an embodiment, the width is substantially constant in dimension, although there may be slight variations. The width and length are often formed using a masking and etching process, which are commonly used in the art.

In an embodiment, the device is also characterized by a spontaneously emitted light that is polarized in substantially perpendicular to the projection of the c-direction (in the a-direction). That is, the device performs as a laser or the like. In an embodiment, the spontaneously emitted light is characterized by a polarization ratio of greater than 0.2 to about 1 perpendicular to the c-direction. In an embodiment, the spontaneously emitted light is characterized by a wavelength ranging from about 400 nanometers to yield a violet emission, a blue emission, a green emission, and/or others. In certain embodiments, the light can be emissions ranging from violet 395 nm to 420 nm; blue 430 nm to 480 nm; green 500 nm to 550 nm; or others, which may slightly vary depending upon the application. In an embodiment, the spontaneously emitted light is highly polarized and is characterized by a polarization ratio of greater than 0.4. In an embodiment, the emitted light is characterized by a polarization ratio that is preferred.

FIG. 2 is a simplified schematic cross-sectional diagram illustrating a laser diode structure according to embodiments of the present disclosure. As shown, the laser device includes gallium nitride substrate 203, which has an underlying n-type metal back contact region 201. In an embodiment, the metal back contact region is made of a suitable material such as those noted below and others.

In an embodiment, the device also has an overlying n-type gallium nitride layer 205, an active region 207, and an overlying p-type gallium nitride layer structured as a laser stripe region 211. Additionally, the device also includes an n-side separate confinement heterostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm to 50 nm, or other thicknesses. In an embodiment, the doping level can be higher than the p-type cladding region and/or bulk region. In an embodiment, the p++ type region has doping concentration ranging from about $10^{19}$ Mg/cm$^3$ to $10^{21}$ Mg/cm$^3$, or others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments, the high quality layer is doped, for example, with Si or O to form n-type material, with a dopant concentration between about $10^{16}$ cm$^{-3}$ and $10^{20}$ cm$^{-3}$.

In an embodiment, an n-type Al$_u$In$_v$Ga$_{1-u-v}$N layer, where 0≤u, v, u+v≤1, is deposited on the substrate. In an embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In an embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm is initiated.

In an embodiment, the laser stripe region is made of the p-type gallium nitride layer 211. In an embodiment, the laser stripe is provided by an etching process selected from dry etching or wet etching. In an embodiment, the etching process is dry, but can be others. As an example, the dry etching process is an inductively coupled plasma process using chlorine bearing species or a reactive ion etching process using similar chemistries or combination of ICP and RIE, among other techniques. Again as an example, the chlorine bearing species are commonly derived from chlorine gas or the like. The device also has an overlying dielectric region, which exposes 213 contact region, which is preferably a p++ gallium nitride region. In an embodiment, the dielectric region is an oxide such as silicon dioxide or silicon nitride, but can be others, such as those described in more detail throughout the present specification and more particularly below. The contact region is coupled to an overlying metal layer 215. The overlying metal layer is a multilayered structure containing gold and platinum (Ni/Au), but can be others such as gold and palladium (Pd/Au), gold, titanium, and palladium (Pd/Ti/Au) or gold and nickel (Pt/Au). In an alternative embodiment, the metal layer comprises Pd/Au formed using suitable techniques. In an embodiment, the Ni/Au is formed via electron-beam deposition, sputtering, or any like techniques. The thickness includes nickel material ranging in thickness from about 50 to about 100 nm and gold material ranging in thickness from about 100 Angstroms to about 1-3 microns, and others.

In an embodiment, the dielectric region can be made using a suitable technique. As an example, the technique may include reactively sputter of SiO$_2$ using an undoped polysilicon target (99.999% purity) with O$_2$ and Ar. In an embodiment, the technique uses RF magnetron sputter cathodes configured for static deposition; sputter target; throw distance; pressure: 1-5 mT or about 2.5 mT, power: 300 to 400 W; flows: 2-3.-9 sccm 02, 20-50 sccm, Ar, deposition thickness: 1000-2500 A, and may include other variations. In an embodiment, deposition may occur using non-absorbing, nonconductive films, e.g., Al$_2$O$_3$, Ta$_2$O$_5$, SiO$_2$, Ta$_2$O$_5$, ZrO$_2$, TiO$_2$, HfO$_2$, NbO$_2$. Depending upon the embodiment, the dielectric region may be thinner, thicker, or the like. In other embodiments, the dielectric region can also include multilayer coatings, e.g., 1000 A of SiO$_2$ capped with 500 A of Al$_2$O$_3$. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like.

In an embodiment, the laser device has active region 207. The active region can include one to twenty quantum well regions according to one or more embodiments. As an example, following deposition of the n-type Al$_u$In$_v$Ga$_{1-u-v}$N layer for a predetermined period of time, so as to achieve a predetermined thickness, an active layer is deposited. The active layer may comprise a single quantum well or a multiple quantum well, with 1-20 quantum wells. Preferably, the active layer may include about 3-9 quantum wells or more preferably 4-7 quantum wells or others. The quantum wells may comprise InGaN wells and GaN barrier layers. In other embodiments, the well layers and barrier layers comprise Al$_w$In$_x$Ga$_{1-w-x}$N and Al$_y$In$_z$Ga$_{1-y-z}$N, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 40 nm. In an embodiment, each of the thicknesses is preferably 2 nm-8 nm. In an embodiment, each well region may have a thickness of about 4 nm to 7 nm and each barrier region may have a thickness of about 2 nm to about 5 nm, among others. In another embodiment, the active layer comprises a double heterostructure, with an InGaN or Al$_w$In$_x$Ga$_{1-w-x}$N layer about 10 nm to 100 nm thick surrounded by GaN or Al$_y$In$_z$Ga$_{1-y-z}$N layers, where w<u, y and/or x>v, z. The composition and structure of the active layer are chosen to provide light emission at a preselected wavelength. The active layer may be left undoped.

In an embodiment, the active region can also include an electron blocking region, and a separate confinement heterostructure. In an embodiment, the separate confinement heterostructure (SCH) can include AlInGaN or preferably InGaN, but can be other materials. The SCH is generally comprised of material with an intermediate index between the cladding layers and the light emitting active layers to improve confinement of the optical mode within the active region of the laser device according to an embodiment. In one or more embodiments, the SCH layers have a preferred thickness, impurity, and configuration above and below the active region to confine the optical mode. Depending upon the embodiment, the upper and lower SCH can be configured differently or the same. The electron blocking region can be on either side or both sides of the SCH positioned above the active region according to an embodiment. In an embodiment, the SCH can range from about 10 nm to about 150 nm, and preferably about 40 to 100 nm for the lower SCH region. In the upper SCH region, the thickness ranges from about 20 to 50 nm in an embodiment. As noted, the SCH is preferably InGaN having about 2% to about 5% indium or 5% to about 10% by atomic percent according to an embodiment.

In some embodiments, an electron blocking layer is preferably deposited. In an embodiment, the electron blocking layer comprises a gallium and nitrogen containing material including magnesium at a concentration of about $10^{16}$ cm$^{-3}$ to about $10^{22}$ cm$^{-3}$. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN with an Al composition ranging from 5% to 20%. In another embodiment, the electron blocking layer may not contain Al. In another embodiment, the electron blocking layer comprises an AlGaN/GaN superlattice structure, comprising alternating layers of AlGaN and GaN, each with a thickness between about 0.2 nm and about 5 nm.

As noted, the p-type gallium nitride structure, which can be a p-type doped $Al_qIn_rGa_{1-q-r}N$, where 0≤q, r, q+r≤1, layer is deposited above the active layer. The p-type layer may be doped with Mg, to a level between about $10^{16}$ cm$^{-3}$ and $10^{22}$ cm$^{-3}$, and may have a thickness between about 5 nm and about 1500 nm. The outermost 5 nm to 70 nm of the p-type layer may be doped more heavily than the rest of the layer, so as to enable an improved electrical contact. In an embodiment, the laser stripe is provided by an etching process selected from dry etching or wet etching. In an embodiment, the etching process is dry, but can be others. The device also has an overlying dielectric region, which exposes 213 contact region. In an embodiment, the dielectric region is an oxide such as silicon dioxide, but can be others.

In an embodiment, the metal contact is made of suitable material. The electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In an embodiment, the electrical contact serves as a p-type electrode for the optical device. In another embodiment, the electrical contact serves as an n-type electrode for the optical device. Of course, there can be other variations, modifications, and alternatives.

FIG. 3 is an example of a conventional laser diode illustrated with a short cavity laser diode. As shown, the short cavity laser diode is substantially shorter and has a cavity length of 50 micrometers to 300 micrometers, although there can be variations.

For compact, low-power, high-volume consumer applications such as embedded pico projection, glass or head mounted displays, and even into low power RGB pointer applications cost will be a critical driver of markets. In conventional laser architectures a reduction of the cavity size will shrink the required chip area by the same factor and hence drive chip cost down by a similar factor. For example, by shrinking chip size from 500 um in conventional design down to 50 um the chip area will be reduced by 10× enabling 10× more chips per wafer to be yielded. To illustrate this dramatic increase in number of chips per wafer FIG. 4 plots the relationship of chip count versus cavity length for a 2 inch substrate assuming a chip width of 150 um and a substrate utilization of 80%. As seen in the figure, the number of chips per 2 inch substrate increases from ~25,000 with a 500 um cavity to over 300,000 chips per 2" substrate with a 50 um cavity.

For the fabrication of high efficiency blue and green gallium and nitrogen containing laser diodes the nonpolar and semipolar crystal orientations are very attractive. By forming light emitting regions on these non-c-plane orientations the piezoelectric and spontaneous internal electric fields associated with c-plane oriented light emitting layers can be mitigated or even eliminated. The result is a higher electron-hole spatial overlap for increased radiative recombination and increased material gain within the semiconductor layers. Moreover, on nonpolar and semipolar orientations as the indium content is increased in the InGaN light emitting regions to transition from a violet wavelength to a blue wavelength and then a green wavelength these internal fields are increased the heavy hole mass is reduced for a further increase in gain and the valence bands are separated for increased polarization. Perhaps most importantly, with the reduction or elimination of the internal fields the design space for laser active region and waveguide design is opened. No longer are quantum wells limited in thickness to under 4 nm or under 3 nm or even under 2 nm for blue and green quantum wells. This enables active region designs with higher optical overlap for increased modal gain.

The higher gain characteristics of nonpolar and semipolar orientations can be exploited for improved laser diode performance in several different device embodiments. In one such embodiment an equivalent laser cavity structure as used on conventional c-plane can be formed on these orientations such that the optical losses are identical. In such an embodiment an increased gain by a factor of 2 to 3× will translate to approximately ½ to ⅓ the threshold current for an overall higher efficiency, as described in "Group III nitride laser diodes grown on a semipolar orientation of gallium nitride," U.S. Ser. No. 61/664,084 filed on Jun. 25, 2012, which is incorporated by reference herein. In this invention we employ nonpolar and semipolar GaN orientations for the fabrications green and/or blue laser diodes where the gain can be 2-3× higher than the conventional c-plane orientation for the fabrication of ultra-short cavity blue and/or green laser for RGB based displays.

The high differential modal gain associated with nonpolar and semipolar laser diodes can enable ultra-short edge emitting laser cavity lengths of 50-300 um with low threshold current densities of below 2-3 kA/cm2 and good high slope efficiencies of over 0.7 W/A, over 1.2 W/A, or over 1.5 W/A. As the cavity length is reduced in an edge-emitting laser diode the mirror loss is increased by an inversely proportionally amount. As the mirror loss is increased the slope efficiency is increased such that a larger increase of output power will be achieved for a given amount of operating current increase above threshold. However, the increased mirror loss will also result in an increased threshold modal gain such that the laser gain medium must achieve a higher modal gain to reach the threshold condition. To illustrate the increasing threshold modal gain with reduced cavity length FIG. 5 presents simulations of the threshold gain versus cavity length for edge emitting GaN-based lasers with an assumed internal loss of 5 cm-1. The solid curve represents a laser with a 99% reflective coating on the back facet and no reflective coating on the front facet, while the dashed curve represents a laser with a 99% reflective coating on the back facet and a 50% reflective coating on the front facet. The curves demonstrate that with no reflective coating on front facet the threshold gain rapidly increases for cavity lengths shorter than 250 um going from about 40 cm-1 at 250 um to 100 cm-1 at 100 um. With a 50% reflective coating on front facet the threshold gain drastically increases for cavity lengths shorter than 100 um going from about 40 cm-1 at 100 um to about 100 cm-1 at 50 um. This indicates that to achieve lasing at a low threshold current density the laser diode must possess high differential modal gain to overcome the cavity loss to reach the threshold gain.

For equivalent device geometry and gain characteristics the higher threshold modal gain associated with shorter cavities would result in a higher threshold current density, and hence increasing the input current required for the laser to achieve high enough gain to reach the threshold condition would be increased. This increased threshold current density limits the practical length of the cavity and counter acts the benefit achieved from higher slope efficiency as the cavity length is reduced. For a fixed modal gain characteristic and internal loss characteristic it is this trade-off that sets the optimal cavity length and the front and back mirror coating reflectivities. For c-plane GaN edge emitting laser diodes operating in the low power regime of less than 300 mW typical cavity lengths range from 400 to 600 um. This cavity length range is largely dictated by the differential modal gain within the conventional c-plane laser diodes which sets the amount of cavity losses can be overcome at a reasonable threshold current density of less than about 4 kA/cm2 or less than about 2 kA/cm2.

In this invention we exploit the high modal gain of nonpolar and semipolar laser diodes to achieve ultra-short cavity lengths with very low threshold currents. FIG. 6 presents an example of simulated gain dependence on current density for blue LDs fabricated on a c-plane orientation with a typical modal differential gain (solid, 7 cm-1/(kA/cm2)) versus those fabricated on NP/SP with a high differential modal gain of 20 cm-1/(kA/cm2). Reasonable values of 200 kA/cm2, 0.02, and 90% were assumed for the transparency current density, gain compression factor, and internal quantum efficiency, respectively. The simulation shows that at 20 kA/cm2, the gain reaches ~60 cm-1 for typical gain GaN LDs, while it improves to ~118 cm-1 for high gain GaN LDs.

The high differential gain possible on NP/SP orientations will enable green and blue ultra-short cavity laser diodes operating with lower threshold current and higher wall plug efficiencies than those fabricated on the conventional c-plane orientation. The high gain characteristic of NP/SP will break the paradigm of 450 um to 600 um cavity lengths currently used in c-plane devices allowing for less than 250 um, less than 200 um, less than 100 um, and even less than 50 um long cavities. This breakthrough and offer several advantages such as reduced cost, higher efficiency, and smaller form factor.

To illustrate how the high gain characteristic of NP/SP enables efficient short cavity laser diodes FIGS. 7a and 7b present examples of simulated threshold current density dependence on laser cavity length for typical c-plane (solid) blue laser designs versus improved NP/SP (dashed) blue laser designs assuming the gain characteristics of FIG. 6. Reasonable values of 200 kA/cm2, 0.02, and 90% were assumed for the transparency current density, gain compression factor, and internal quantum efficiency, respectively. FIG. 7a assumes a 99% reflectivity coating on the rear facet and no coating on the front facet and FIG. 7b assumes a 99% reflectivity coating on the rear facet and a 50% reflective coating on the front facet. As seen in FIG. 7a, with no front facet coating the typical c-plane device would have a threshold current density that would drastically increase from 3 kA/cm2 to 7 kA/cm2 when shortening the cavity length from 400 um to 200 um. However, for the high gain NP/SP devices the threshold current densities would be 1.5 kA/cm2 and 3 kA/cm2 for the same cavity lengths, respectively. Moreover, for a 100 um cavity length the threshold current density could be ~4.5 kA/cm2. By increasing the front facet reflectivity the threshold current densities can be reduced. As seen in FIG. 7b, with a 50% reflective front facet coating the typical c-plane device would have a threshold current density that would drastically increase from 2.5 kA/cm2 to 5 kA/cm2 when shortening the cavity length from 400 um to 200 um. However, for the high gain NP/SP devices the threshold current densities would be 1.2 kA/cm2 and 2 kA/cm2 for the same cavity lengths, respectively. Moreover, for a 100 um cavity length the threshold current density could be ~3 kA/cm2.

Low Threshold Current with Short Cavity NP/SP LDs:

The threshold current of a laser diode is a critical parameter as it dictates the amount of electrical input power required to reach the lasing condition. This parameter becomes increasingly critical to the overall performance of the device as the target output power is reduced and the operating current (Top) approaches the threshold current (Ith). Operating far above threshold current reduces the temperature sensitivity of the device output power and increases the relaxation resonance frequency, which are often both desirable characteristics. Moreover, conventional cavity lengths of 450 um to 600 um combined with the conventional c-plane gain characteristic used for low power devices are typically limited to above 20-25 mA in the blue and above 40-50 mA in the green in a configuration providing reasonable efficiency. That is, the threshold current could be reduced further with increased facet reflectivity, but the slope efficiency would be reduced to the point where the overall efficiency of the laser suffered. In applications where very low powers of 5-20 mW are required threshold currents of greater than 20 mA are not compatible with reasonable wall plug efficiency. Therefore, conventional cavity lengths of 450-600 um combined with conventional c-plane gain characteristics are not configured optimally to serve the low power space. In this invention where we combine high gain NP/SP GaN laser diodes with ultra-short cavities threshold currents of below 10 mA or even below 5 mA are possible while maintaining a high slope efficiency and thus a high wall plug efficiency.

To illustrate how the high gain characteristic of NP/SP enables low threshold current short cavity laser diodes FIGS. 8a and 8b presents examples of simulated threshold current dependence on laser cavity length for typical c-plane (solid) blue laser designs versus improved NP/SP (dashed) blue laser designs assuming the gain characteristics of the FIGS. 6, 7a, and 7b. The emitter width is fixed at 1.5 um and reasonable values of 200 kA/cm2, 0.02, 90%, and 5 cm-1 were assumed for the transparency current density, gain compression factor, internal quantum efficiency, and internal loss, respectively. FIG. 8a assumes a 99% reflectivity coating on the rear facet with no coating on the front facet and FIG. 8b assumes a 99% reflectivity coating on the rear facet with a 50% reflective coating on the front facet. As seen in FIG. 8a, with no front facet coating the typical c-plane device would have a threshold current of 35 mA at a 400 um cavity length and 60 mA with a 100 um cavity length. However, for the high gain NP/SP devices the threshold currents would be 15 mA and 20 mA for the same cavity lengths, respectively. By increasing the front facet reflectivity the threshold currents can be reduced. As seen in FIG. 8b, with a 50% reflective front facet coating the typical c-plane device would have a threshold current of about 17 mA for both a 400 um and 100 um cavity length. However, for the high gain NP/SP devices the threshold current would be about 7 mA in a 400 um cavity and about 6 mA in a 100 um cavity. Such single digit threshold current would offer a huge advantage in low power applications.

FIGS. 8a and 8b illustrated that very low threshold currents of 5-8 mA can be achieved in high-gain short cavity lasers using a front facet coating to increase the reflectivity, but it is important to consider the effect to the slope efficiency with increased facet reflectivity since the slope efficiency must remain high to achieve a favorable wall plug efficiency. FIG. 9 plots an example of slope efficiency (W/A) versus cavity lengths assuming an internal loss of 5 cm-1 and a rear facet reflectivity of 99% for the cases of an uncoated front facet, a front facet with a 50% reflective coating, and a front facet with a 75% reflective coating. As can be seen in this figure, for lengths in the conventional 400 um to 600 um range the 50% reflective coating will result in a reduction of slope efficiency from about 1.8-2 W/A to about 1.3 to 1.6 W/A, which is substantial. However, in the ultra-short cavity regime of 100 um to 200 um the slope efficiency is only reduced from about 2.4-2.2 W/A to about 1.9-2.2 W/A, which is only a modest reduction. A 75% reflective coating can be implemented for cavity lengths in the 30 to 80 um length without severe reduction of the slope efficiency. Now that the threshold current and the slope efficiency have been mapped out in FIGS. 8a and 8b, a light versus current (LI) characteristic curve can be constructed. FIG. 10 plots the simulated LI curves for blue LDs fabricated on the typical gain versus those with high gain where the front facet is coated for a ~50% reflectivity, and the cavity is 100 um long by 1.5 um wide. As seen in the figure, for 20 mW output power the operating currents are 25.1 mA and 15 mA for typical gain and high gain GaN LDs, respectively.

With the clear benefits of the LI characteristic offered by high gain NP/SP laser diodes in short cavity configurations illustrated in FIG. 10, the electrical characteristics can be considered to evaluate the overall efficiency improvement of the high gain short cavity devices. FIG. 11 presents the simulated curves of WPE versus voltage at 5 mW and 20 mW output power for blue LDs fabricated on the typical gain c-plane orientations versus those fabricated on high gain NP/SP orientations where the front facet is coated for a ~50% reflectivity, and the cavity is 100 um long by 1.5 um wide. As seen in the figure, at 5 mW output power, the WPE is 6.9% at 4V and reduced to 3.4% at 8V for typical gain GaN LDs, while the WPE is 15.5% at 4V and reduced to 7.7% at 8V for high gain GaN LDs. This represents over a 2× increase in efficiency for any equivalent operating voltage when operated at 5 mW. At 20 mW output power, the WPE is 20% at 4V and reduced to 10% at 8V for typical gain GaN LDs, while the WPE is 33.4% at 4V and reduced to 16.7% at 8V for high gain GaN LDs. This represents over a 1.5× increase in efficiency for the high gain laser diodes at 20 mW. The lower operating current and higher efficiency of the nonpolar or semipolar laser diode devices will result in extended battery life of the electronic apparatus.

In an example, the relaxation resonance frequency of a directly modulated laser diode limits the overall modulation bandwidth of the laser in a well-designed device. The relaxation resonance frequency ($\omega R$) is given by equation 1.0;

$$\omega_R = \left(\frac{\Gamma v_g a}{qV} \eta_i(I - I_{th})\right)^{\frac{1}{2}}$$

Where $\Gamma$ is the optical confinement factor, $v_g$ is the group velocity, a is the differential gain, $\eta i$ is the injection efficiency, q is the fundamental charge, V is the volume of the active region, $I_{th}$ is the threshold current, and I is the operating current. From this equation it is clear that to maximize the relaxation resonance frequency the device design should aim for a high optical confinement factor ($\Gamma$), a high differential gain (a), a minimized active region volume (V) is given by the product of the cavity length, cavity width, and total active layer thickness, and maximize the ($I-I_{th}$) term through minimizing the threshold current and operating at a high operation current. The high gain, short cavity laser diodes in this invention will offer a high relaxation resonance frequency and hence will be capable of high modulation rates into the GHz range.

As described above, NP/SP orientations with reduced internal fields, lower effective mass of holes in the valence band, and larger separation between the valence bands offers many fold advantages several of which will function to enhance the modulation response. The most fundamental advantage offered by NP/SP is the 3-4× higher differential material gain (a) resulting from the higher radiative recombination efficiency and lighter hole mass where the volume of photons generated per injected carrier density is much higher. By the expression given above, the higher differential gain offered by NP/SP can increase the relaxation resonance by a factor of 2. Moreover, the eliminated or mitigated internal fields in NP/SP enable a larger total active region layer thickness through increased thickness of each of the quantum well layers along with more quantum well layers. For example, a typical c-plane blue LD active region would have 2-3 quantum wells each with a thickness of 2 to 3 nm for a total thickness of 4 to 9 nm whereas a NP/SP blue LD may have 4-6 quantum wells each with a thickness of 4 to 8 nm for a total thickness of 16 to 48 nm. This represents an increase in active layer thickness of up to about 12× and in most design will have a proportional or super proportional relationship with the optical confinement factor assuming all the quantum well layers are evenly populated with carriers under operation. Therefore, the thick active region designs enabled by the NP/SP orientations will enable high confinement factors driving up relaxation resonance frequency.

The active region volume term (V) term in the denominator is given by the product of the total active layer thickness (d), the cavity width (w), and the cavity length (l). The short cavity NP/SP devices with high confinement active region will be disadvantaged by the total active layer thickness described above since this leads to an increased volume as well as increasing the confinement factor. However, the relaxation resonance frequency penalty resulting from the high total active layer thickness will be offset by the increase in optical confinement with proper design resulting in either a wash or a modest improvement to the overall resonance frequency. The other two factors in the active region volume term are the cavity length and cavity width. The width of the short cavity NP/SP laser diodes would be equivalent to that of a c-plane device so there is no differentiation within that term. However, the essence of the invention is ultra-short cavities in the 50 to 300 um range which is much shorter than the conventional 450 to 600 um cavities. Thus, the short cavity devices will increase the relaxation resonance frequency by up to 3×.

The low threshold current properties associated with ultra-short cavity NP/SP LDs described above will drive the $(I-I_{th})$ term larger and hence additionally contribute to an enhanced relaxation resonance frequency.

In an example, the short-cavity, low threshold current, highly efficient red, green, and blue laser diodes offering high modulation rate operation enable unique packaging options for RGB modules. In FIG. 12 we present a conventional TO-Can type package with R-G-B laser chips all mounted on the same pedestal. The short and low power consumption chips can allow for deployment in the smallest of TO-cans such as the TO38 to realize an RGB laser module in the same form factor that usually houses a single color laser diode. FIG. 13 illustrates one embodiment for collimating the beams using an optic and then spatially combining the beams from a TO-Can package type.

FIG. 14 shows modified TO-can type package with a unique triangular pedestal design such that the three R-G-B laser chips are each mounted on one side of the pedestal. The pedestal is shaped to receive multiple chip on submount with or without attached optics. The shape allows beam rough beam directionality. Fine adjustment would be performed with micro actuators on lenses. TO-can packages are typically constructed with copper and/or steel.

In more advanced package configurations the RGB laser light sources could be assembled into a non-standard form factor. FIG. 15 presents R-G-B short cavity laser chips mounted on a common carrier (submount) with the laser beams collimated using optics mounted near the laser aperture. With the short cavity chips the carriers could be made very tiny. For example, if the cavity lengths of the chips are 150 um and the widths are 150 um, the carrier could be less than 0.5 mm long and less than 1 mm wide, or even smaller depending on the spatial limitations of chip positioning. In another embodiment, each of the R-G-B chips could be mounted on their own carrier and then mounted on a common platform or back plane. In such an embodiment, the spatial requirements would be similar as they would be for a common carrier embodiment. Alternatively, chips with a desired color could be mounted on the same platform or carrier. Construction material for the carriers, submounts, and platforms used to mount and combine the R-G-B laser chips could be selected from ceramics such as AlN or BeO, metal such as copper, steel, or aluminum, silicon, or even plastic compounds designed with appropriate properties and electrical configurations. For such low power applications geared for consumer applications cost will be critical so low cost materials such as silicon would be ideal. Moreover, the assembly could be planar (2D") or ("3D") using more sides of the "motherboard", or assembling individual "motherboard" in 3D configuration.

In addition to mounting the laser chips on carriers, submounts, and or common platforms to realize a RGB module with a single combined red, green, and blue output beam the output from each of the three lasers must be beam shaped and collimated. There are many ways to do this including lens such as a fast-axis collimating lens, a slow axis collimating lens, single aspherical, spherical, or more complex optics such as diffractive or holographic. Beam shaping could also be done using microlens array or waveguides (2D or 3D). The alignment of such optics is critical as they must be precisely positioned and can be the most costly aspect of the module assembly cost. Lens alignment could be done passively (dropping lens on a patterned "motherboard") or actively on a bench or using miniaturized integrated mechanical actuators (ex.: MEMS) technologies. Lenses would be fixed in place by means of organic adhesives or soldering, or could be left mobile and maintain realignment adjustment through the use of miniaturized actuators. This concept can be used for a single lasers or a single mother board with patterned actuator could receive multiple lasers. In FIG. 16, (a) presents an example of single laser diode chip mounted on carrier with micro-actuator for optical alignment and coupling and (b) RGB laser diode chips mounted on carriers with micro-actuators for alignment and coupling. Using such a MEMS based technology could be ideal for low cost, high volume alignment techniques.

After optics alignment for collimation and beam shaping, the laser beams must be combined. There are several ways to combine beams. Different color beams could be combined in free space where the beams are arranged in any desired patterned (line, triangle, rectangle and round if more than 3 . . . ) In another method fiber coupling could be used to combine the beams where each single laser is fiber coupled then all fibers are combined together, bundled, melted together, or combined using a commercial combiners. In another method, waveguide technologies can be used where each of the lasers are coupled into a unique waveguide and then the separate waveguides are combined into a single output waveguide. This waveguide combining chip could be formed out of glass, silicon, GaN or any other suitable material that will not be absorbing to the R-G-B light. The waveguide combiner could be designed to use a simple 2D geometry or a more complex 3D technologies. As an example, ion diffusion in glass can create 2D and 3D structures. FIG. 17 presents an example of R-G-B laser diode chips mounted on carriers and then coupled into a glass waveguide for beam combination. Waveguides could be used to convert pitch and pattern beams into any desired shape in 2D or 3D. Waveguide can be used to change aperture of each beam. Waveguide can be fabricated on glass, silicon, or plastic.

Once the R-G-B chips are mounted on same platform using a network of carriers, submounts, and/or platforms and the beams are collimated and combined, the missing elements are the enclosure and electrical leads. Various materials can be used to form an enclosure such as metals, ceramics, silicon, plastics, or other materials. The module may be hermetically sealed or in other embodiments the chips could be designed to operate in only an environmentally sealed package, or even in the open environment. In such cases, full enclosure of the chips would be required for the module. In FIG. 18, (a) provides an example of a fully enclosed micro RGB module where form factor could range from 0.5-4 mm wide, 0.5-4 mm long, and 0.5 to 4 mm tall. In FIG. 18, (b) illustrates now miniature these RGB modules are by comparing a micro module form factor to a conventional TO38 package form factor.

FIG. 19 is an example of miniature RGB laser module with dimensions of 3 mm×3 mm×0.5 mm. In this example configuration the laser diodes output beams are fed through lenses for beam collimation, which are aligned by micro-actuators. The collimated beams are then coupled into a waveguide beam combining device for an output RGB beam.

FIG. 20 is an RGB module configured with a fixed lens according to an example. In this concept, the light is coupled to the beam shaping waveguide using an optic or set of optics, aligned actively or passively and then fixed in place using glue or solder.

FIG. 21 is an RGB module vertically coupled according to an example. The concept here is to use optics (mirrors) to reflect the laser light vertically to convert the alignment critical in X & Y into more easily adjustable Z & X directions. The light is then coupled into a waveguide for beam shaping.

FIG. 22 is an RGB module vertically coupled according to an example. The concept here is to reflect the laser light vertically using mirrors etched on the laser, the waveguide, or both, to convert the critical alignment in X & Y into more easily adjustable Z & X directions. The light is then coupled into a waveguide for beam shaping.

FIG. 23 is an RGB module configured on a wearable display. A very small size, very light weight, low consumption RGB micro module can easily be integrated on an existing board and be used as light source in a wearable display like glasses or watches.

In an example, the present invention can be applied to a variety of applications, such as mobile displays, micro displays, and the like.

An example of a mobile device is known as Google Glass, which has been described in part below. See also www.wikipedia.com.

Camera:
Google Glass has the ability to take photos and record 720p HD video. While video is recording, the screen stays on.

Touchpad:
A user controls Google Glass using the touchpad built into the side of the device. A touchpad is located on the side of Google Glass, allowing users to control the device by swiping through a timeline-like interface displayed on the screen. Sliding backward shows current events, such as weather, and sliding forward shows past events, such as phone calls, photos, circle updates, etc.

Technical Specifications:
  For the developer Explorer units:
  Android 4.0.4 and higher
  640×360 display
  5-megapixel camera, capable of 720p video recording
  Wi-Fi 802.11b/g
  Bluetooth
  16 GB storage (12 GB available)
  Texas Instruments OMAP 4430 SoC 1.2 Ghz Dual (ARMv7)
  682 MB RAM "proc".
  3 axis gyroscope
  3 axis accelerometer
  3 axis magnetometer (compass)
  Ambient light sensing and proximity sensor
  Bone conduction transducer.
  Of course, there can be variations.

In an example, the present invention provides an apparatus to be configured on a human head for images. The apparatus has a frame member configured to fit on the head of a human being. The apparatus has a display region coupled to the frame member and spatially disposed to allow the human user to view the display and a laser diode source. The device also has a wave guide structure having a first region and a second region, the first region being coupled to the display region, and the second region being coupled to the laser diode source, and configured to traverse electromagnetic radiation from the laser diode source through the wave guide structure to cause an image to be outputting on the display.

FIG. 24 is a simplified diagram illustrating a wearable augmented reality glasses incorporating projection display systems using diffractive waveguide to deliver the image to the eye. As shown, the image enters the waveguide in a small aperture of 1 cm or less with collimation of 20 degrees or less, and is diffracted at an angle by diffractive feature written directly into the waveguide or coupled to it, and then is reflected with total internal reflection, or diffracted with additional diffractive features, so as to be directed laterally across the waveguide. The image is then incident on a final diffractive element and expanded or contracted as needed so as to illuminate the eye. The diffractive element is fabricated with photosensitive materials, and the waveguide is fabricated with glass, plastic, silicon, or other materials such that it is more than 50% transparent to ambient light, enabling the viewer to see through the waveguide to the environment beyond the optical elements in the glasses. The spatial brightness of the laser image enables the use of high efficiency coupling into the waveguide input, and use of ultra-thin waveguides less than 1 cm and in some cases less than 1 mm. The spectral brightness of the laser image comes from the fact that the source is generated with red, green, and blue laser beams, each having a spectral width of less than 10 nm and in some cases less than 5 nm and in some cases less than 2 nm. The narrow spectrum allows the waveguide optical system to divert only laser light into the waveguide, through the waveguide laterally, and to the eye. The vast majority of the ambient light, in excess of 50%, will fall outside of the narrow spectral region of the lasers and will pass perpendicularly through the waveguide directly into the eye, enabling the viewer to see a bright laser display image overlapped with a bright ambient image from the environment.

Figure 25:
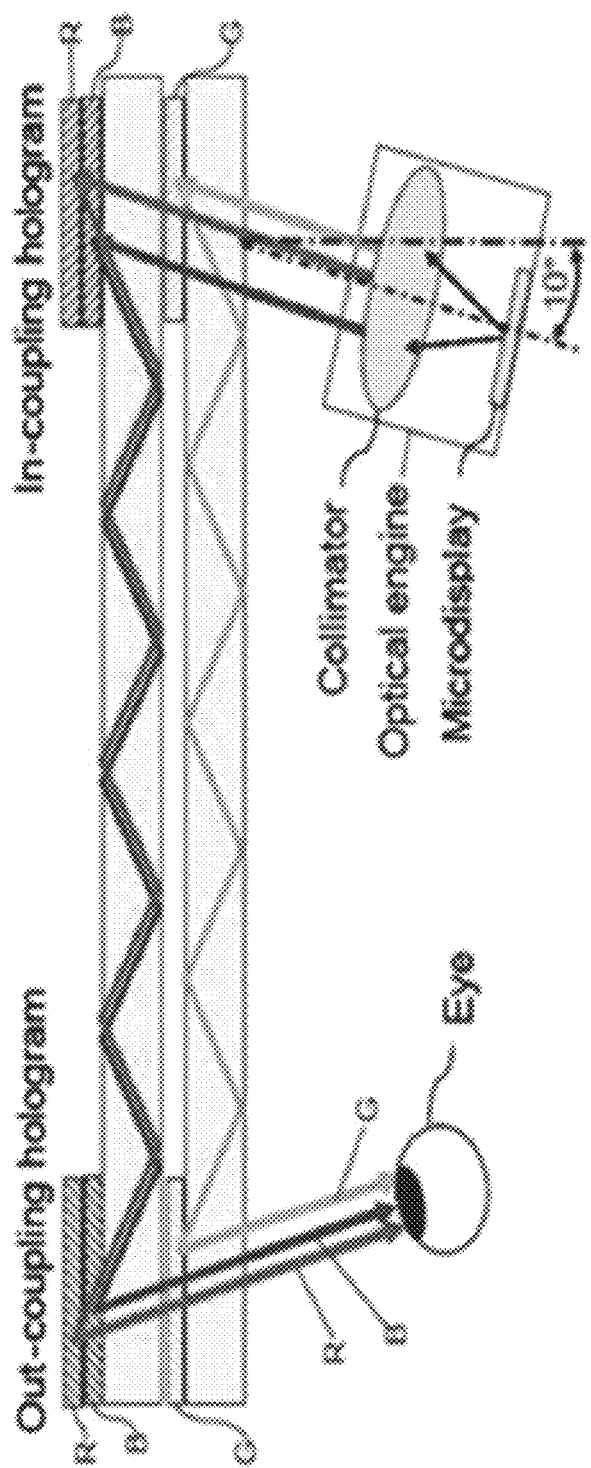
FIG. 25 is a simplified diagram illustrating a wearable augmented reality glasses incorporating projection display systems using holographic waveguide to deliver the image to the eye.

FIG. 25 is a simplified diagram illustrating a wearable augmented reality glasses incorporating projection display systems using holographic waveguide to deliver the image to the eye.

As shown, the image enters the waveguide in a small aperture of 1 cm or less with collimation of 20 degrees or less, and is directed at an angle by a holographic feature written directly into the waveguide or coupled to it, and then is reflected with total internal reflection, or directed with additional holographic features, so as to be directed laterally across the waveguide. The image is then incident on a final holographic element and expanded or contracted as needed so as to illuminate the eye. In the figure shown, a waveguide and holographic elements for green are included, and a second waveguide is used for red and blue, with both red and blue holographic elements included on the second waveguide. In other embodiments, a single waveguide, or multiple waveguides can be used. Each holographic element is fabricated with photosensitive materials, and the waveguide element is fabricated with glass, plastic, silicon, or other materials such that it is more than 50% transparent to ambient light, enabling the viewer to see through the waveguide to the environment beyond the optical elements in the glasses. The spatial brightness of the laser image enables the use of high efficiency coupling into the waveguide input, and use of ultra-thin waveguides less than 1 cm and in some cases less than 1 mm. The spectral brightness of the laser image comes from the fact that the source is generated with red, green, and blue laser beams, each having a spectral width of less than 10 nm and in some cases less than 5 nm and in some cases less than 2 nm. The narrow spectrum allows the waveguide optical system to divert only laser light into the waveguide, through the waveguide laterally, and to the eye. The vast majority of the ambient light, in excess of 50%, will fall outside of the narrow spectral region of the lasers and will pass perpendicularly through the waveguide directly into the eye, enabling the viewer to see a bright laser display image overlapped with a bright ambient image from the environment.

Figure 26:
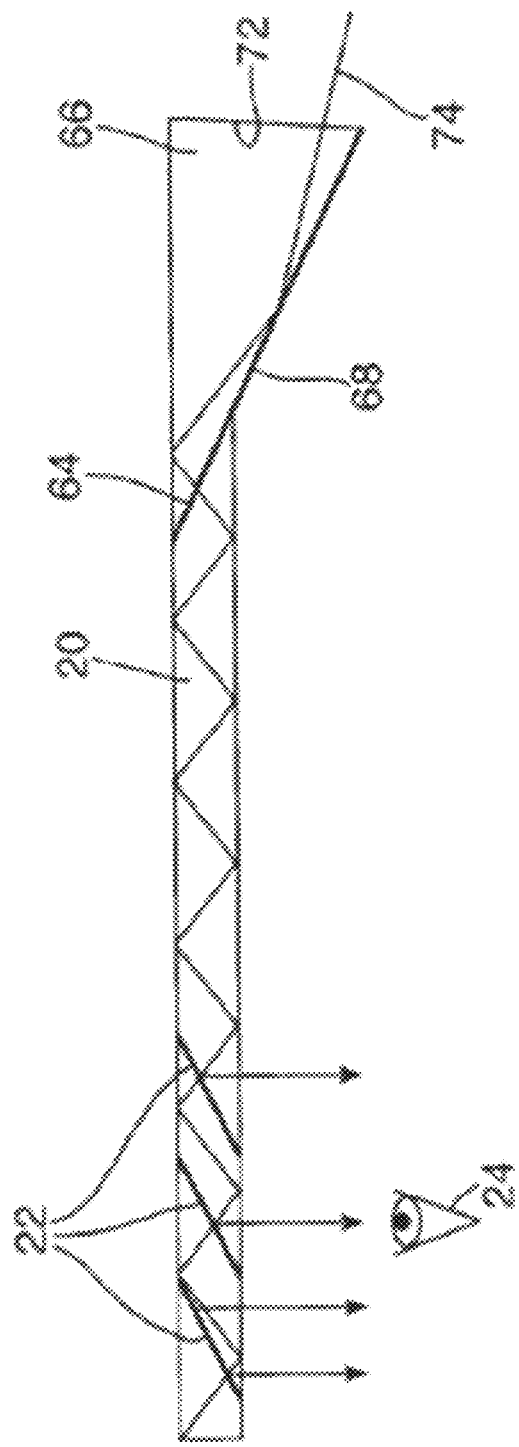
FIG. 26 is a simplified diagram illustrating a wearable augmented reality glasses incorporating projection display systems using polarized waveguide to deliver the image to the eye.

FIG. 26 is a simplified diagram illustrating a wearable augmented reality glasses incorporating projection display systems using polarized waveguide to deliver the image to the eye.

As shown, the image enters the waveguide in a small aperture of 1 cm or less with collimation of 20 degrees or less, and is directed at an angle by a reflective interface that reflects a particular polarization state of the light, and then is reflected with total internal reflection, or directed with additional polarization sensitive features, so as to be directed laterally across the waveguide. The image is then incident on a final polarization sensitive reflective element and expanded or contracted as needed so as to illuminate the eye. In the figure shown, separate polarization sensitive reflective elements for green, red, and blue are included, and may also include spectral selectivity due to selective optical coatings or interfaces which reflect only the narrow spectrum of the laser light. Each polarization sensitive element is fabricated with optical coatings or materials with polarization sensitivity or wavelength sensitivity, and the waveguide element is fabricated with glass, plastic, silicon, or other materials such that it is more than 50% transparent to ambient light, enabling the viewer to see through the waveguide to the environment beyond the optical elements in the glasses. The spatial brightness of the laser image enables the use of high efficiency coupling into the waveguide input, and use of ultra-thin waveguides less than 1 cm and in some cases less than 1 mm. The spectral brightness of the laser image comes from the fact that the source is generated with red, green, and blue laser beams, each having a spectral width of less than 10 nm and in some cases less than 5 nm and in some cases less than 2 nm. The narrow spectrum allows the waveguide optical system to divert only laser light into the waveguide, through the waveguide laterally, and to the eye. The vast majority of the ambient light, in excess of 50%, will fall outside of the narrow spectral region of the lasers and will pass perpendicularly through the waveguide directly into the eye, enabling the viewer to see a bright laser display image overlapped with a bright ambient image from the environment.

Figure 27:
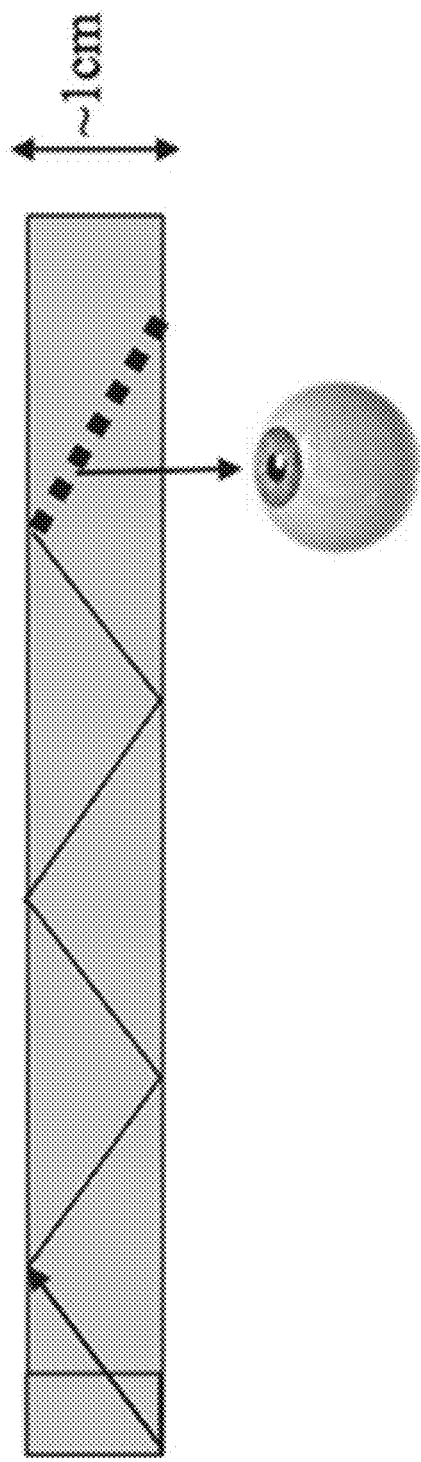
FIG. 27 is a simplified diagram illustrating a wearable augmented reality glasses incorporating projection display systems using reflective waveguide to deliver the image to the eye.

FIG. 27 is a simplified diagram illustrating a wearable augmented reality glasses incorporating projection display systems using reflective waveguide to deliver the image to the eye.

As shown, the image enters the waveguide in a small aperture of 1 cm or less with collimation of 20 degrees or less, and is directed at an angle by with total internal reflection, laterally across the waveguide. The image is then incident on a final reflective element and expanded or contracted as needed so as to illuminate the eye. In the figure shown, a common waveguide is shown, and other embodiments may include the use of multiple waveguides such as 1 for each color. The waveguide may also include spectral selectivity due to selective optical coatings or interfaces which reflect only the narrow spectrum of the laser light. The waveguide element is fabricated with glass, plastic, silicon, or other materials such that it is more than 50% transparent to ambient light, enabling the viewer to see through the waveguide to the environment beyond the optical elements in the glasses. The spatial brightness of the laser image enables the use of high efficiency coupling into the waveguide input, and use of ultra-thin waveguides less than 1 cm and in some cases less than 1 mm. The spectral brightness of the laser image comes from the fact that the source is generated with red, green, and blue laser beams, each having a spectral width of less than 10 nm and in some cases less than 5 nm and in some cases less than 2 nm. The narrow spectrum allows the waveguide optical system to divert only laser light into the waveguide, through the waveguide laterally, and to the eye. The vast majority of the ambient light, in excess of 50%, will fall outside of the narrow spectral region of the lasers and will pass perpendicularly through the waveguide directly into the eye, enabling the viewer to see a bright laser display image overlapped with a bright ambient image from the environment.

Figure 28:
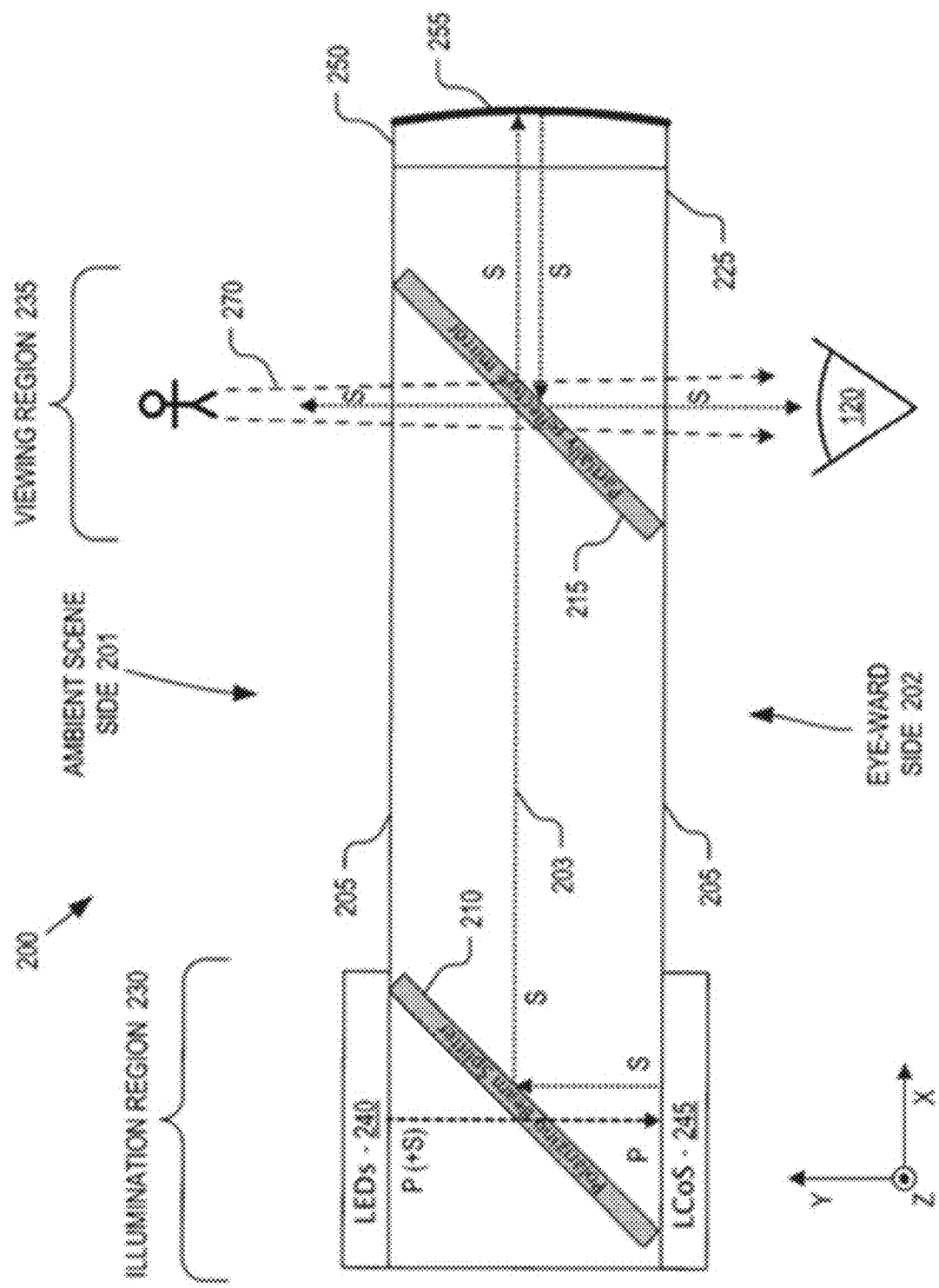
FIG. 28 is a simplified diagram illustrating a wearable augmented reality glasses incorporating projection display systems using reflective waveguide to deliver the image to the eye.

FIG. 28 is a simplified diagram illustrating a wearable augmented reality glasses incorporating projection display systems using reflective waveguide to deliver the image to the eye.

As shown, LED and LCOS combination prohibits the use of a thin waveguide, and cause a large aperture and large size polarization beam splitter and partially reflecting mirror, making the device too thick (1 cm or more). Because LEDs are used, the spectrum of the light is large, more than 10 nm, and therefore selective optical coatings are not used to enable high brightness images from the environment to pass in a transparent manner through the waveguide to the eye.

Figure 29:
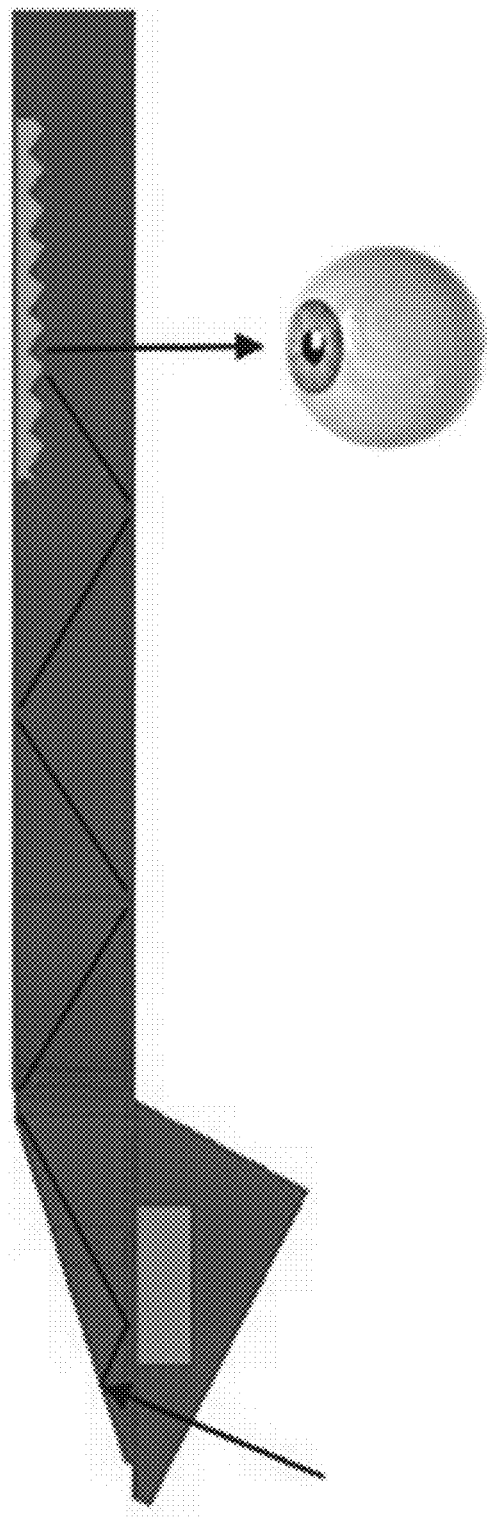
FIG. 29 is a simplified diagram illustrating a wearable augmented reality glasses incorporating projection display systems using reflective waveguide to deliver the image to the eye.

FIG. 29 is a simplified diagram illustrating a wearable augmented reality glasses incorporating projection display systems using reflective waveguide to deliver the image to the eye.

As shown, the image enters the waveguide in a small aperture of 1 cm or less with collimation of 20 degrees or less, and is directed at an angle by with total internal reflection, laterally across the waveguide. The image is then incident on a final reflective element and expanded or contracted as needed so as to illuminate the eye. In the figure shown, a common waveguide is shown, and other embodiments may include the use of multiple waveguides such as 1 for each color. The waveguide may also include spectral selectivity due to selective optical coatings or interfaces which reflect only the narrow spectrum of the laser light. The waveguide element is fabricated with glass, plastic, silicon, or other materials such that it is more than 50% transparent to ambient light, enabling the viewer to see through the waveguide to the environment beyond the optical elements in the glasses. The spatial brightness of the laser image enables the use of high efficiency coupling into the waveguide input, and use of ultra-thin waveguides less than 1 cm and in some cases less than 1 mm. The spectral brightness of the laser image comes from the fact that the source is generated with red, green, and blue laser beams, each having a spectral width of less than 10 nm and in some cases less than 5 nm and in some cases less than 2 nm. The narrow spectrum allows the waveguide optical system to divert only laser light into the waveguide, through the waveguide laterally, and to the eye. The vast majority of the ambient light, in excess of 50%, will fall outside of the narrow spectral region of the lasers and will pass perpendicularly through the waveguide directly into the eye, enabling the viewer to see a bright laser display image overlapped with a bright ambient image from the environment.

Figure 30:
FIG. 30 are images illustrating various wearable augmented reality glasses incorporating projection display systems. These products suffer from being highly distracting and have high power consumption.

FIG. 30 are images illustrating various wearable augmented reality glasses incorporating projection display systems. These products suffer from being highly distracting and have high power consumption.

FIG. 31 is a comparison of various wearable glasses incorporating projection display systems. These products suffer from being highly distracting and have high power consumption, and do not offer bright images in the form factor of transparent discreet eye-glasses.

In an example, the present laser device and module can be configured on a display of a smart phone, which includes the following features (which are found in an iPhone 4 from Apple Computer, although there can be variations), see www.apple.com.
- GSM model: UMTS/HSDPA/HSUPA (850, 900, 1900, 2100 MHz); GSM/EDGE (850, 900, 1800, 1900 MHz)
- CDMA model: CDMA EV-DO Rev. A (800, 1900 MHz)
- 802.11b/g/n Wi-Fi (802.11n 2.4 GHz only)
- Bluetooth 2.1+EDR wireless technology
- Assisted GPS
- Digital compass
- Wi-Fi
- Cellular
- Retina display
- 3.5-inch (diagonal) widescreen Multi-Touch display
- 800:1 contrast ratio (typical)
- 500 cd/m2 max brightness (typical)
- Fingerprint-resistant oleophobic coating on front and back
- Support for display of multiple languages and characters simultaneously
- 5-megapixel iSight camera
- Video recording, HD (720p) up to 30 frames per second with audio
- VGA-quality photos and video at up to 30 frames per second with the front camera
- Tap to focus video or still images
- LED flash
- Photo and video geotagging
- Built-in rechargeable lithium-ion battery
- Charging via USB to computer system or power adapter
- Talk time: Up to 7 hours on 3G, up to 14 hours on 2G (GSM)
- Standby time: Up to 300 hours
- Internet use: Up to 6 hours on 3G, up to 10 hours on Wi-Fi
- Video playback: Up to 10 hours
- Audio playback: Up to 40 hours
- Frequency response: 20 Hz to 20,000 Hz
- Audio formats supported: AAC (8 to 320 Kbps), Protected AAC (from iTunes Store), HE-AAC, MP3 (8 to 320 Kbps), MP3 VBR, Audible (formats 2, 3, 4, Audible Enhanced Audio, AAX, and AAX+), Apple Lossless, AIFF, and WAV
- User-configurable maximum volume limit
- Video out support at up to 720p with Apple Digital AV Adapter or Apple VGA Adapter; 576p and 480p with Apple Component AV Cable; 576i and 480i with Apple Composite AV Cable (cables sold separately)
- Video formats supported: H.264 video up to 720p, 30 frames per second, Main Profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, Simple Profile with AAC-LC audio up to 160 Kbps per channel, 48 kHz, stereo audio in .m4v, .mp4, and .mov file formats; Motion JPEG (M-JPEG) up to 35 Mbps, 1280 by 720 pixels, 30 frames per second, audio in ulaw, PCM stereo audio in .avi file format
- Three-axis gyro
- Accelerometer
- Proximity sensor
- Ambient light sensor An exemplary electronic device may be a portable electronic device, such as a media player, a cellular phone, a personal data organizer, or the like. Indeed, in such embodiments, a portable electronic device may include a combination of the functionalities of such devices. In addition, the electronic device may allow a user to connect to and communicate through the Internet or through other networks, such as local or wide area networks. For example, the portable electronic device may allow a user to access the internet and to communicate using e-mail, text messaging, instant messaging, or using other forms of electronic communication. By way of example, the electronic device may be a model of an iPod having a display screen or an iPhone available from Apple Inc.

In certain embodiments, the device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, device may be sized such that it fits relatively easily into a pocket or a hand of the user. While certain embodiments of the present invention are described with respect to a portable electronic device, it should be noted that the presently disclosed techniques may be applicable to a wide array of other, less portable, electronic devices and systems that are configured to render graphical data, such as a desktop computer.

In the presently illustrated embodiment, the exemplary device includes an enclosure or housing, a display, user input structures, and input/output connectors. The enclosure may be formed from plastic, metal, composite materials, or other suitable materials, or any combination thereof. The enclosure may protect the interior components of the electronic device from physical damage, and may also shield the interior components from electromagnetic interference (EMI).

The display may be a liquid crystal display (LCD), a light emitting diode (LED) based display, an organic light emitting diode (OLED) based display, or some other suitable display. In accordance with certain embodiments of the present invention, the display may display a user interface and various other images, such as logos, avatars, photos, album art, and the like. Additionally, in one embodiment, the display may include a touch screen through which a user may interact with the user interface. The display may also include various function and/or system indicators to provide feedback to a user, such as power status, call status, memory status, or the like. These indicators may be incorporated into the user interface displayed on the display.

In an example, the device also includes a laser module configured with a micro-display to form a light engine. Examples of the RGB module have been described throughout the present specification. Micro-displays can be comprised of a scanning MEMS mirror, an LCOS chip, or a digital light processing chip.

According to an embodiment, the present invention provides a projection system. The projection system includes an interface for receiving video. The system also includes an image processor for processing the video. The system includes a light source including a plurality of laser diodes.

The plurality of laser diodes includes a blue laser diode. The blue laser diode is fabricated on non-polar oriented gallium nitride material. The system includes a power source electrically coupled to the light source.

According to another embodiment, the present invention provides a projection system. The system includes an interface for receiving video. The system also includes an image processor for processing the video. The system includes a light source including a plurality of laser diodes. The plurality of laser diodes includes a blue laser diode. The blue laser diode is fabricated on semi-polar oriented gallium nitride material. The system also includes a power source electrically coupled to the light source.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. In this embodiment, the blue and the green laser diode would share the same substrate. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a MEMS scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. In this embodiment, two or more of the different color lasers would be packaged together in the same enclosure. In this copackaging embodiment, the outputs from the blue, green, and red laser diodes would be combined into a single beam. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus includes a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a digital light processing chip (DLP) comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

According to yet another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The green laser diode has a wavelength of about 490 nm to 540 nm. The laser source is configured produce a laser beam by coming outputs from the blue, green, and red laser diodes. The apparatus includes a digital light processing chip comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof. Further details can be found In U.S. Pat. No. 8,427,590, commonly assigned, and hereby incorporated by reference herein.

In one embodiment, one or more of the user input structures are configured to control the device, such as by controlling a mode of operation, an output level, an output type, etc. For instance, the user input structures may include a button to turn the device on or off. Further the user input structures may allow a user to interact with the user interface on the display. Embodiments of the portable electronic device may include any number of user input structures, including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

The exemplary device may also include various input and output ports to allow connection of additional devices. For example, a port may be a headphone jack that provides for the connection of headphones. Additionally, a port may have both input/output capabilities to provide for connection of a headset (e.g., a headphone and microphone combination). Embodiments of the present invention may include any number of input and/or output ports, such as headphone and headset jacks, universal serial bus (USB) ports, IEEE-1394 ports, and AC and/or DC power connectors. Further, the device may use the input and output ports to connect to and send or receive data with any other device, such as other portable electronic devices, personal computers, printers, or the like. For example, in one embodiment, the device may connect to a personal computer via an IEEE-1394 connection to send and receive data files, such as media files. Further details of the device can be found in U.S. Pat. No. 8,294,730, assigned to Apple, Inc.

In an example, in display applications, the RGB laser source based on ultrashort chips offers several advantages. In conventional RGB laser modules, long chip are used and have limited rise time and therefore modulation speed. This results commonly in using analog modulation to determine the brightness of each pixel in scanning MEMs devices, and long pulse exposure of panels in LCOS and DLP based displays. In these arrangements, laser beam coherence and interference cause visible image quality issues called speckle which are undesirable. By utilizing short chips, shorter rise times for the pulse are possible than longer chips, enabling faster modulation. This enables high speed pulse width modulation (PWM) to be used in order to minimize coherence and interference each time the laser is pulsed, resulting in scrambling of the spectrum which reduces speckle and improves image quality.

In another example, another advantage of RGB laser source based on ultrashort chips is related to the color purity of the image quality. In conventional RGB laser modules using long chips, image artifacts are generated when dark to bright spots in the image cause the lasers to go from a dim state to a bright state. As this occurs, the laser heats, and the threshold current changes. That change in threshold current makes the correlation between pixel or frame brightness and operating current inaccurate, and resulting in incorrect brightness to be delivered to the screen and color quality to suffer. These changes are visible to the human eye and are a drawback to the image quality delivered by RGB modules with long chips. By utilizing a short ship laser design, the threshold current is substantially lower, and therefore the change in threshold current with temperature is reduced. This enables increased accuracy in the correlation between pixel or frame brightness and operating current, and therefore superior image quality, regardless of the bright and dark transitions in an image or video.

Another advantage of RGB laser source based on ultrashort chips is related to the reduced power consumption due to the reduced threshold current, which is especially important when the display is operating at dim levels.

Other advantages in include reduced size and reduced cost of RGB laser source based on ultrashort chips and micro-optical components, versus RGB laser source based on large chips and bulk macro-optical optical components.

In summary, RGB laser source based on ultrashort chips offer brightest images with best image quality, highest efficiency, smallest form factor, and lowest cost structure in high volume in an example.

In an example, the present RGB source can have a variety of applications, as noted below, and throughout the present specification.

Applications of RGB laser source based on ultrashort chips include display, novelty, biomedical, defense, and industrial.

Display applications include heads up displays for the automotive aftermarket segment, as well as the embedded automotive market for new cars.

Display applications also include pico projectors embedded in mobile phones, cameras, phablets, tables, set top boxes, video games, Go-Pro camera, along with other wearable or portable consumer electronics such as watches. Use cases include sharing of images and videos, as well as personal viewing of large images for web surfing and entertainment.

Multiple dim projectors using RGB laser source based on ultrashort chips can be utilized together to produce bright images with multiple points of view for broadly viewable glasses free 3D applications.

One or more projectors using RGB laser source based on ultrashort chips can be used in conjunction with holographic material to produce 3D virtual images that appear in the space above the holographic material and projector.

Projectors using RGB laser source based on ultrashort chips can be used in wearable displays with a highly transparent window or glasses upon which images and video can be shown for the purposes of sharing information. Such displays are both transmissive meaning that the information is added to the image that your eye sees, without blocking it, in some cases registered to in with some reference, and as well as interactive, meaning that the image can be turned on or off or dimmed or otherwise manipulated.

For example, in biomedical applications such as in collaborative surgery, or in training to show figures schematics or anatomical information, or patient vital signs and status.

Other application that are collaborative, such as educational or on the job training, where sharing of information from a manual or instructions are to be overlaid with one's own eye's image, such as a mechanic viewing the engine design diagrams that is overlaid onto the vehicle image his own eye sees.

Such applications include augmented reality, where images from other sensors can also be added such as thermal images, IR night vision enhancement, UV imaging, photo excited illumination such as phosphors such as in defense for live training and battlefield situations, or as recently described for Disney books, or for forensics excitation of invisible dyes or powders that cameras can see Firefighter seeing hot door Security seeing which car in parking lot was just driven due to heat.

Other non-display applications include novelty and entertainment products such as pointers and miniature discotec light shows defense and security white pointers, white dazzlers, white laser illuminators and military vehicle headlamps industrial metrology, machine vision, construction levels and line generators biomedical instrumentation where RGB colors are desired for excitation of some fluorescent dyes for enhanced imaging such as in confocal microscopy, therapeutic treatment where multiple wavelengths may be used in conjunction for various absorption and or penetration depths in the tissue.

Of course, there can be variations.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Provisional Application No. 61/347,800, commonly assigned, and hereby incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27, 2010, which claims priority to U.S. Provisional Nos. 61/182,105 filed May 29, 2009 and 61/182,106 filed May 29, 2009, each of which is hereby incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semi-polar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. A wearable display system configured with a laser module apparatus comprising:
a package member comprising a surface region;
a blue laser diode configured on the package member, the blue laser diode comprising a first gallium and nitrogen containing material, the first gallium and nitrogen containing material comprising a first quantum well region, the first quantum well region configured with one or a plurality of quantum wells;
a first laser cavity configured with the first quantum well region, the first laser cavity having a first length of 500 um and less;
a green laser diode configured on the package member, the green laser diode comprising a second gallium and nitrogen containing material, the second gallium and nitrogen containing material comprising a second quantum well region, the second quantum well region configured with one or a plurality of quantum wells;
a second laser cavity configured with the second quantum well region, the second laser cavity having a second length of 500 um and less;
a red laser diode configured on the package member;
a first optical device coupled to a first laser pathway for the blue laser diode, the first optical device arranged to receive light emitted from a first facet of the blue laser diode and reflected from a first mirror in the blue laser diode, the first mirror arranged external to the first laser cavity;
a second optical device coupled to a second laser pathway for the green laser diode, the second optical device arranged to receive light emitted from a first facet of the green laser diode and reflected from a second mirror in the green laser diode, the second mirror arranged external to the second laser cavity;
a third optical device coupled to a third laser pathway for the red laser diode, the third optical device arranged to receive light emitted from a first facet of the red laser diode and reflected from a third mirror in the red laser diode, the third mirror arranged external to a third laser cavity of the red laser diode;
a beam combiner configured with the first laser pathway, the second laser pathway, and the third laser pathway to create a combined beam of red, green, and blue laser light;
an electrical driver module coupled to each of the blue laser diode, the green laser diode, and the red laser diode; whereupon the electrical driver module configured to individually supply a unique signal comprised of electrical power to each of the blue laser diode, the green laser diode, and the red laser diode; and
a light engine comprising a micro-display configured with the package member, the blue laser diode, the green laser diode, the red laser diode, the first optical device, the second optical device, and the third optical device; whereupon the light engine is configured as glasses for a human user.

2. The system of claim 1 wherein the micro-display is comprised of a scanning MEMS mirror, an LCOS, or a digital light processing chip.

3. The system of claim 1 wherein the first mirror of the blue laser diode is an etched facet mirror, wherein the second mirror of the green laser diode is an etched facet mirror, and/or wherein the third mirror of the red laser diode is an etched facet mirror.

4. The system of claim 1 wherein the first optical device is a collimating lens, wherein the second optical device is a collimating lens, and/or wherein the third optical device is a collimating lens.

5. The system of claim 4 wherein the first, second, or third optical device is SAC lens, a FAC lens, or a combination thereof.

6. The system of claim 1 wherein the light engine is configured with a frame for a pair of glasses.

7. The system of claim 1 wherein the first length is 400 um and less or 300 um and less or 200 um and less or 100 um and less; and wherein the second length is 400 um and less or 250 um and less or 100 um and less.

8. The system of claim 1 wherein the package member comprises an intermediate carrier, the intermediate carrier is selected from at least one of a silicon, a metal, a plastic, a composite, or a ceramic.

9. The system of claim 1 wherein the blue laser diode, the green laser diode, and the red laser diode each has a power of less than 5 mW, less than 15 mW, or less than 30 mW.

10. The system of claim 1 wherein the blue laser diode, the green laser diode, and the red laser diode each has a power of less than 50 mW, less than 100 mW, or less than 200 mW.

11. The system of claim 1 wherein a spatial length dimension of the laser module apparatus is less than 8 mm, less than 5 mm, less than 3 mm, or less than 1 mm, wherein a spatial width dimension of the laser module apparatus is less than 8 mm, less than 5 mm, less than 3 mm, or less than 1 mm, and wherein a spatial height dimension of the laser module apparatus is less than 8 mm, less than 3 mm, or less than 1 mm.

12. The system of claim 1 wherein the beam combiner is configured from a free-space configuration.

13. The system of claim 1 wherein the beam combiner is configured from a waveguide device.

14. The system of claim 1 wherein the package member is made of a silicon, a metal, a plastic, a composite, or a ceramic.

15. The system of claim 1 wherein first and/or second gallium and nitrogen containing substrate is configured with a semi-polar or a non-polar surface region.

16. The system of claim 1 wherein first and second gallium and nitrogen containing substrates is configured with a {20-21} surface region; wherein the second laser cavity is oriented in a projection of a c-direction; wherein the first laser cavity comprises a first ridge structure comprising a pair of first etched facets.

17. The system of claim 1 wherein the second laser cavity comprises a second ridge structure comprising a pair of second etched facets.

* * * * *